(12) United States Patent
Lee et al.

(10) Patent No.: US 6,646,719 B2
(45) Date of Patent: Nov. 11, 2003

(54) SUPPORT ASSEMBLY FOR AN EXPOSURE APPARATUS

(75) Inventors: Martin E. Lee, Saratoga, CA (US); Bausan Yuan, San Jose, CA (US); Yutaka Hayashi, Yokohoma (JP)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/773,289

(22) Filed: Jan. 31, 2001

(65) Prior Publication Data

US 2002/0102481 A1 Aug. 1, 2002

(51) Int. Cl.[7] .......................... G03B 27/58; G03B 27/42
(52) U.S. Cl. ........................ 355/72; 355/53; 248/638
(58) Field of Search ..................... 355/53, 72; 248/550, 248/638; 250/492.2; 318/560, 625, 648, 649; 428/199

(56) References Cited

U.S. PATENT DOCUMENTS

| 5,150,153 | A | * | 9/1992 | Franken et al. ............... 355/53 |
| 5,204,712 | A | * | 4/1993 | Bouwer et al. ................ 355/53 |
| 5,844,666 | A |   | 12/1998 | Van Engelen et al. |
| 5,909,272 | A | * | 6/1999 | Osanai et al. ................ 355/53 |
| 5,933,215 | A | * | 8/1999 | Inoue et al. .................. 355/53 |
| 5,953,105 | A | * | 9/1999 | Van Engelen et al. ........ 355/53 |
| 5,986,743 | A | * | 11/1999 | Hanzawa ..................... 248/550 |
| 6,008,883 | A | * | 12/1999 | Kobayashi ................ 250/492.1 |
| 6,271,640 | B1 | * | 8/2001 | Lee ............................ 318/560 |
| 6,316,849 | B1 |   | 11/2001 | Konkola et al. |
| 6,320,645 | B1 | * | 11/2001 | Inoue et al. ................. 318/640 |
| 6,421,112 | B1 | * | 7/2002 | Bisschops et al. ............ 355/53 |

\* cited by examiner

*Primary Examiner*—Alan A. Mathews
(74) *Attorney, Agent, or Firm*—Steven G. Roeder; Jim Rose

(57) ABSTRACT

A support assembly (12) for an exposure apparatus (10) is provided herein. The support assembly (12) supports the components of the exposure apparatus (10) above a mounting base (32). The exposure apparatus (10) includes noisy components (42) and quiet components (44). The support assembly (12) includes an outer frame (34) and an inner frame (36). As provided herein, the outer frame (34) supports some of the components of the exposure apparatus (10) and the inner frame (36) supports some of the components of the exposure apparatus (10). Preferably, the outer frame (34) is used to support the quiet components (44) while the inner frame (36) is used to support the noisy components (42). Uniquely, a portion of the inner frame (36) is positioned within a portion of the outer frame (34). As a result of this design, both frames (34) (36) can effectively be mounted at the same mounting locations 37 of the mounting base (32). Further, the overall space taken up by the frames (34) (36) is minimized.

75 Claims, 15 Drawing Sheets

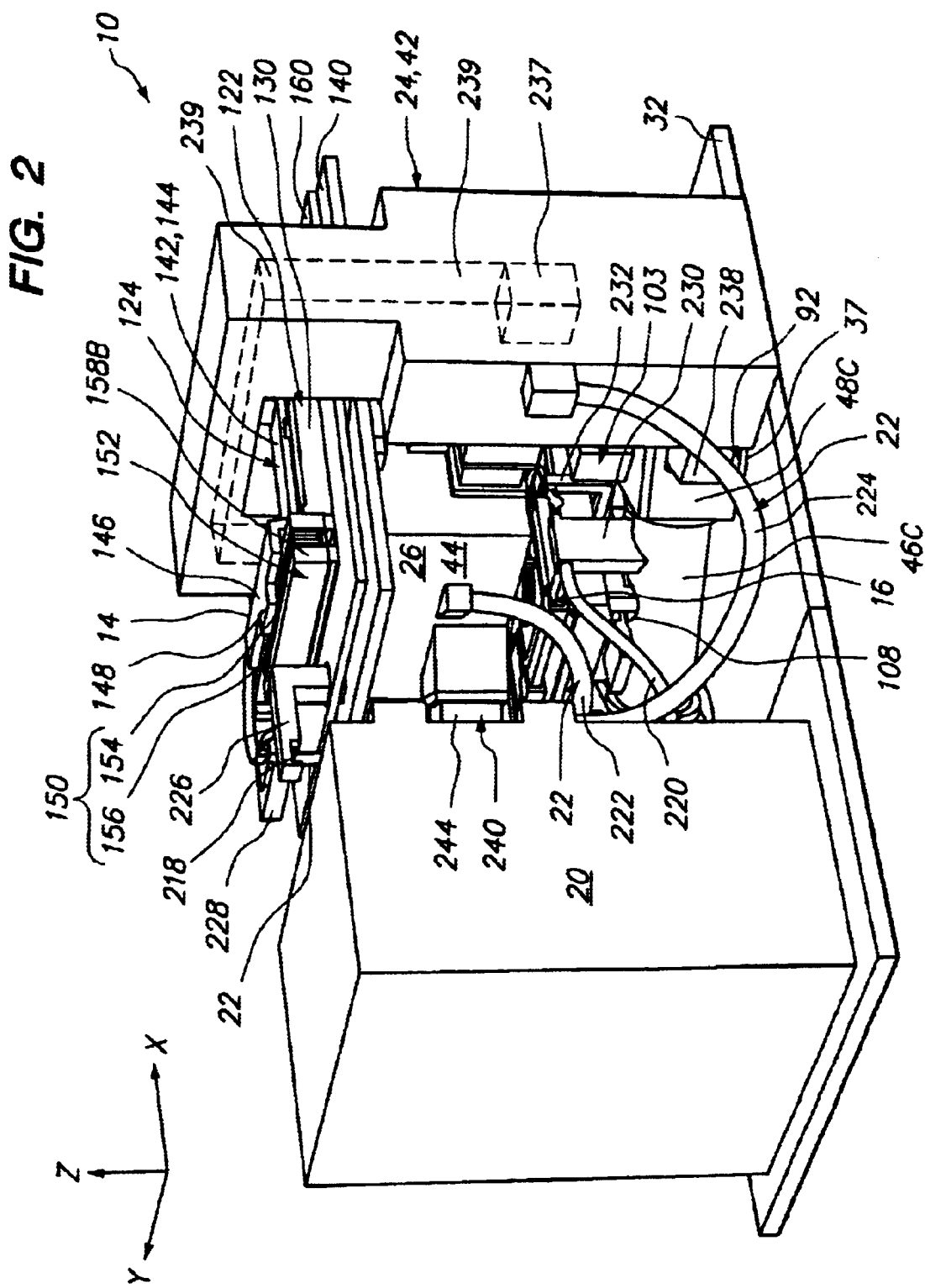

SUPPORT ASSEMBLY FOR AN EXPOSURE APPARATUS

FIELD OF THE INVENTION

The present invention is directed to exposure apparatuses. More specifically, the present invention is directed to a support assembly for an exposure apparatus and a method for making a support assembly for an exposure apparatus.

BACKGROUND

Exposure apparatuses are commonly used to transfer images from a reticle onto a semiconductor wafer during semiconductor processing. A typical exposure apparatus includes a support assembly, a measurement system, a plurality of control lines, a control system, an illumination source, a lens assembly, a reticle stage for retaining a reticle, and a wafer stage for retaining a semiconductor wafer.

The support assembly typically supports the measurement system, the illumination source, the reticle stage, the lens assembly, and the wafer stage above the ground. The measurement system monitors the positions of the stages. The control lines carry an electrical current between the components of the exposure apparatus. The wafer stage includes one or more motors to precisely position the wafer relative to the lens assembly. Similarly, the reticle stage includes one or more motors to precisely position the reticle relative to the lens assembly.

The size of the images transferred onto the wafer from the reticle is extremely small. Accordingly, the precise relative positioning of the wafer and the reticle is critical to the manufacture of high density, semiconductor wafers.

Unfortunately, mechanical vibrations and deformations in the support assembly of the exposure apparatus can influence the accuracy of the exposure apparatus. For example, the motors utilized to move the stages generate reaction forces that vibrate and deform the support assembly of the exposure apparatus. Additionally, the control lines carry vibration from the control system and other items that the control lines touch on the way to the exposure apparatus that also vibrate the exposure apparatus and the support assembly.

The vibrations and deformations in the support assembly can move the stages and the lens assembly out of precise relative alignment. Further, the vibrations and deformations in the support assembly can cause the measurement system to improperly measure the relative positions of the stages. As a result thereof, the accuracy of the exposure apparatus and the quality of the integrated circuits formed on the wafer can be compromised.

One attempt to solve this problem involves the use of a support assembly having a main frame and a reaction frame. The main frame is used to support most of the components of the exposure apparatus above the ground, while the reaction frame is used to transfer the reaction forces from the motors of the stages to the ground.

Unfortunately, with this design, the reaction frame occupies space in the exposure apparatus that was previously available to other components of the exposure apparatus. As a result thereof, the exposure apparatus will be required to have a larger footprint in order to accommodate the reaction frame. Further, access to the reaction frame can be limited. Thus, it can be difficult to connect each significantly vibrating component to the reaction frame. Moreover, the reaction frame limits access to the other components of the exposure apparatus.

In light of the above, it is an object of the present invention to provide an improved support assembly for an exposure apparatus. Another object is to provide a support assembly that reduces the influence of vibration from the motors of the exposure apparatus on the position of the stages, the lens assembly, and the measurement system. Still another object is to provide a support assembly having a relatively small footprint. Yet another object is to provide a support assembly having a reaction frame that is easily accessible. Another object is to provide a support assembly that is relatively inexpensive to manufacture. Yet another object of the present invention is to provide a support assembly that transfers the vibration from the motors and the illumination source to the ground so that the reticle stage and the wafer stage can be precisely positioned. Another object is to provide an exposure apparatus capable of manufacturing precision devices, such as high density, semiconductor wafers.

SUMMARY

The present invention is directed to a support assembly that satisfies these needs. The support assembly is designed to support a stage assembly above a mounting base. The stage assembly includes a first component and a second component. The support assembly includes an outer frame that supports the first component and an inner frame that supports the second component. The support assembly and stage assembly are particularly useful with an exposure apparatus for transferring an image from a reticle onto a device.

Uniquely, a portion of the inner frame is positioned within a portion of the outer frame. As a result of this design, both frames can effectively be mounted at the same mounting locations to the mounting base. This minimizes the impact of vibration of the mounting base influencing the support assembly. Further, the overall space taken up by the frames is minimized. This allows the support assembly to have a smaller footprint and allows the components of the stage assembly and/or the exposure apparatus to be more accessible.

As used herein, the term "noisy components" shall mean and include any component of the stage assembly and/or the exposure apparatus that generates significant vibration, reaction forces, and resonant forces. As used herein, the term "quiet components" shall mean and include any component of the stage assembly and/or the exposure apparatus that does not generate significant vibration, reaction forces, and resonant forces. Importantly, the noisy components typically generate significantly more vibration, reaction forces, and resonant forces than the quiet components.

Preferably, one of the frames is utilized as a reaction frame while the other frame is utilized as a quiet frame. The reaction frame supports and secures the noisy components to the mounting base. Alternately, the quiet frame supports and secures the quiet components to the mounting base. With this design, the reaction forces from the noisy components can be easily transferred to the mounting base and isolated from the quiet components. This allows for more accurate positioning of the reticle and the device, and the manufacture of higher density, semiconductor wafers.

In one of the embodiments provided herein, (i) the outer frame includes a first side outer tube, a second side outer tube, and a third side outer tube and (ii) the inner frame includes a first side inner tube, a second side inner tube, and a third side inner tube. Further, in this embodiment, (i) the first side inner tube is positioned within the first side outer tube, (ii) the second side inner tube is positioned within the second side outer tube, and (iii) the third side inner tube is positioned within the third side outer tube.

Additionally, the outer frame includes an outer base, and the inner frame includes an inner base that is positioned within the outer base. More specifically, the outer base includes a first base outer tube, a second base outer tube, and a third base outer tube. The inner base includes a first base inner tube, a second base inner tube, and a third base inner tube. As provided herein, (i) the first base inner tube is positioned within the first base outer tube, (ii) the second base inner tube is positioned within the second base outer tube, and (iii) the third base inner tube is positioned within the third base outer tube.

In another embodiment of the present invention, the support assembly includes a first tube, a constraining tube, and a dampener. In this embodiment, the constraining tube is positioned within the first tube and the dampener is positioned between and is affixed to both the first tube and the constraining tube.

The present invention is also directed to a method for making a support assembly, a method for making an exposure apparatus, a method for making a device, and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 2 is a rear perspective view of the exposure apparatus of FIG. 1;

DESCRIPTION

Figure 1:
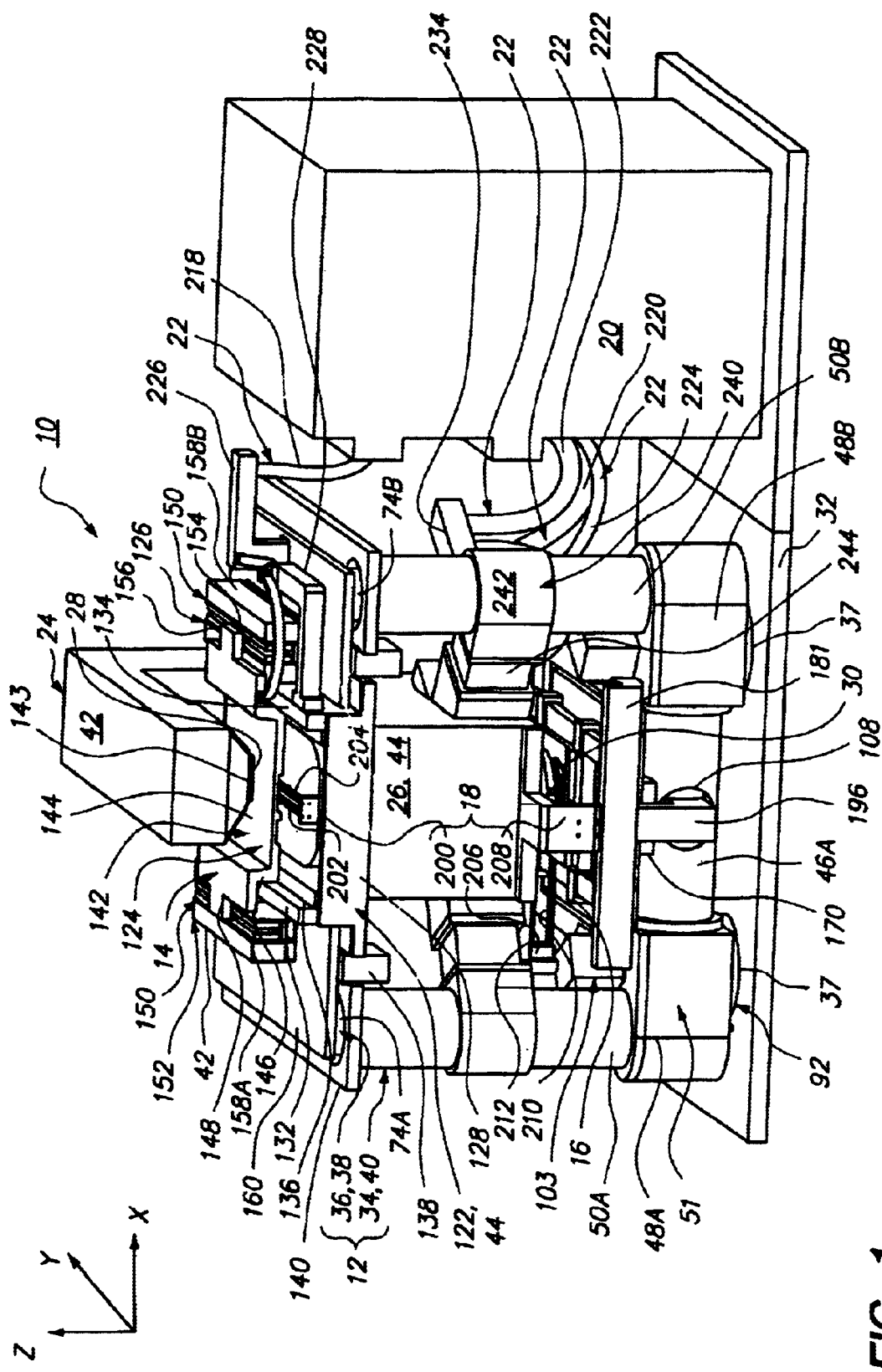
FIG. 1 is a front perspective view of an exposure apparatus having features of the present invention.

FIGS. 1–3B illustrate an exposure apparatus 10 and a support assembly 12 having features of the present invention. In addition to the support assembly 12, the exposure apparatus 10 includes a first stage assembly 14, a second stage assembly 16, a measurement system 18, a control system 20, a plurality of control lines 22, an illumination system 24 (irradiation apparatus), and a lens assembly 26. The exposure apparatus 10 is particularly useful as a lithographic device that transfers a pattern (not shown) of an integrated circuit from a reticle 28 onto a device 30 such as a semiconductor wafer. Alternately, as discussed below, the exposure apparatus 10 can be used in the manufacture of other types of devices 30.

Some of the Figures provided herein include a coordinate system that designates an X axis, a Y axis, and a Z axis. It should be understood that the coordinate system is merely for reference and can be varied. For example, the X axis can be switched with the Y axis and/or the exposure apparatus 10 can be rotated.

The support assembly 12 illustrated in the Figures supports some of the components of the exposure apparatus 10 above a mounting base 32. Alternately, for example, the support assembly 12 can be used to support the components of another type of machine or apparatus. For example, the support assembly can be used in an apparatus (i) that moves a device under an electron microscope (not shown), (ii) that moves a device during a precision measurement operation (not shown), (iii) that moves a device during an inspection process (not shown), or (iv) that moves a device during a precision manufacturing operation.

The design of the support assembly 12 can be varied to suit the design requirements for the rest of the exposure apparatus 10. As provided herein, the support assembly 12 is rigid and includes an outer frame 34 and an inner frame 36.

The outer frame 34 supports some of the components of the exposure apparatus 10, and the inner frame 36 supports some of the components of the exposure apparatus 10. Uniquely, the inner frame 36 is mainly positioned within the outer frame 34. As a result of this design, both frames 34, 36 can effectively be mounted at the same mounting locations 37 on the mounting base 32. This minimizes the impact of vibration of the mounting base 32 on the support assembly 12. Further, the overall spaced taken up by the frames 34, 36 is minimized.

Preferably, one of the frames 34, 36 is utilized as a reaction frame 38 while the other frame 34, 36 is utilized as a quiet frame 40. The reaction frame 38 supports and secures the components of the exposure apparatus 10 that generate significant vibration, reaction forces, and resonant forces (hereinafter "noisy components 42") to the mounting base 32. Alternately, the quiet frame 40 supports and secures the components of the exposure apparatus 10 that do not generate significant vibration and resonant forces (hereinafter "quiet components 44") to the mounting base 32. With this design, the reaction forces from the noisy components can be easily transferred to the mounting base 32, and isolated from the quiet components 44 of the exposure apparatus 10. This allows for more accurate positioning of the reticle 28 and the device 30 and the manufacture of higher quality wafers.

The components of the exposure apparatus 10, that are considered to be noisy components 42 or quiet components 44, will vary according to the design of the exposure apparatus 10. As provided herein, the noisy components 42 typically generate more vibration, reaction forces, and/or resonant forces than the quiet components 44. Typically, the noisy components 42 generate at least approximately 200 percent more vibration, reaction forces, and/or resonant forces than the quiet components 44. For the exposure apparatus 10 illustrated herein, the noisy components 42 include a portion of each stage assembly 14, 16, and the illumination system 24, while the quiet components 44 include a portion of each stage assembly 14, 16, the measurement system 18, some of the control lines 22, and the lens assembly 26.

The design of the support assembly 12 can be varied to suit the design requirements of the machine. In the embodiments illustrated herein, the inner frame 36 secures the noisy components 42 of the exposure apparatus 10 to the mounting base 32, while the outer frame 34 secures the quiet components 44 of the exposure apparatus 10 to the mounting base 32. With this design, the inner frame 36 is considered the reaction frame 38, while the outer frame 34 is considered the quiet frame 40. Alternately, the inner frame could be designed to be the quiet frame while the outer frame could be designed to be the reaction frame.

Because the inner frame 36 is positioned within the outer frame 34, the present design provides relatively easy access to components of the exposure apparatus 10 for assembly, service and maintenance of the exposure apparatus 10. Further, the present design provides relatively easy access to mount the various components of the exposure apparatus 10 to the frames 34, 36.

Figure 4:
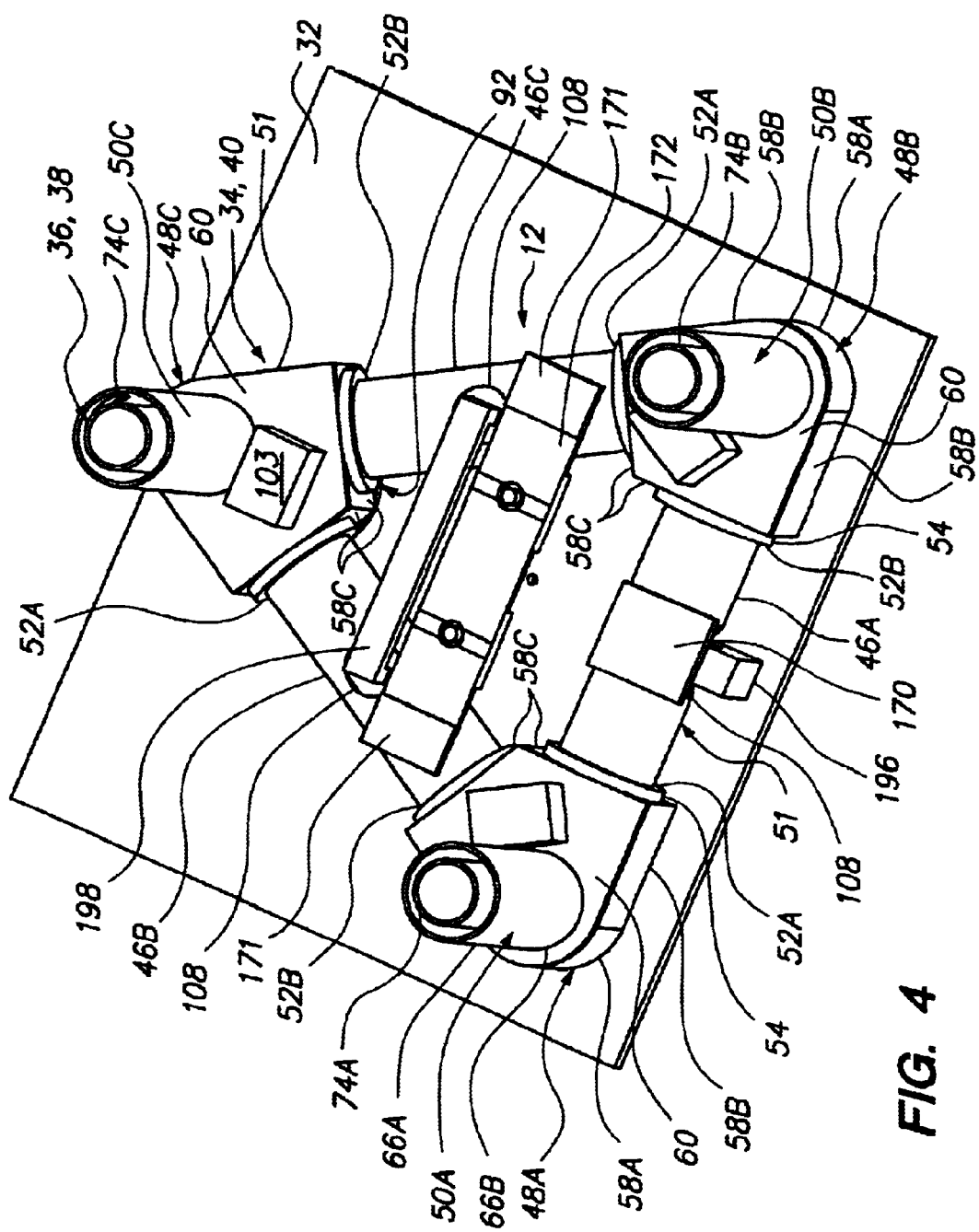
FIG. 4 is a top perspective view of a support assembly having features of the present invention.
Figure 5A:
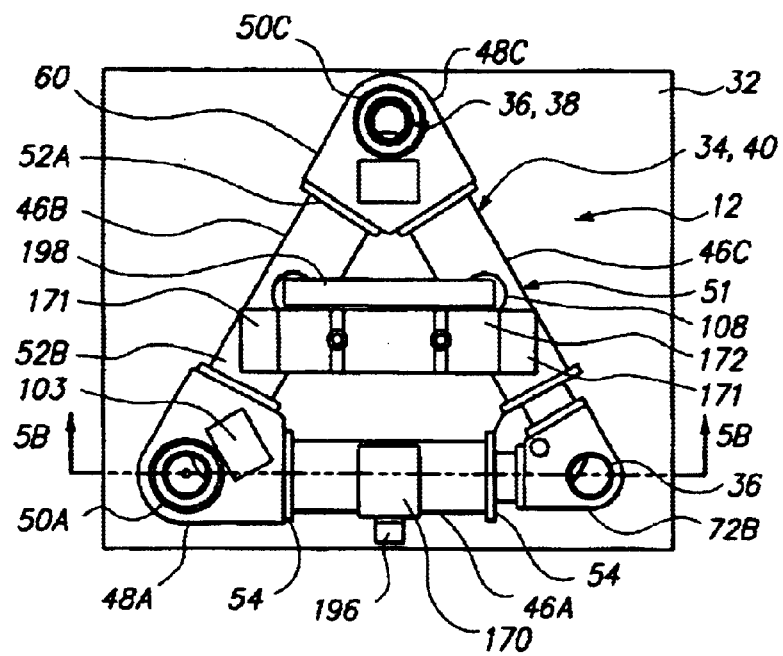
FIG. 5A is a top plan view of the support assembly of FIG. 4 without one outer corner.
Figure 5B:
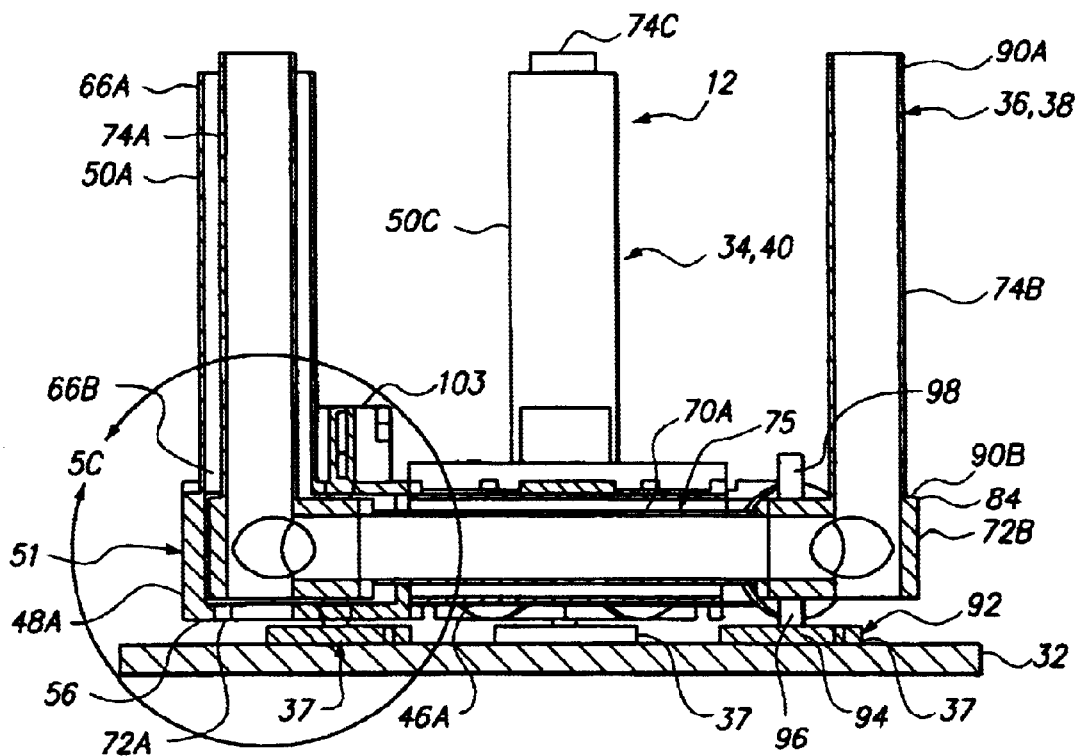
FIG. 5B is a cut-away view taken on line 5B—5B in FIG. 5A.

Referring to FIGS. 4–5B, the outer frame 34 includes (i) a first base outer tube 46A, (ii) a second base outer tube 46B, (iii) a third base outer tube 46C, (iv) a first outer corner 48A, (v) a second outer corner 48B, (vi) a third outer corner 48C, (vii) a first side outer tube 50A, (viii) a second side outer tube 50B, and (ix) a third side outer tube 50C. The three base outer tubes 46A–46C are connected together with the outer corners 48A–48C to form a triangular shaped outer base 51. Further, each of the side outer tubes 50A–50C extend upward and substantially vertically from one of the outer corners 48A–48C.

Each of the base outer tubes 46A–46C has a first end 52A and an opposed second end 52B. Preferably, each end 52A, 52B of each base outer tube 46A–46C includes an outer attachment flange 54 for ease of assembly of the outer frame 34. The shape, size and thickness of the base outer tubes 46A–46C can be varied to suit the design requirements for the support assembly 12. For example, for an exposure apparatus 10, each of the base outer tubes 46A–46C can have an annular shaped cross-section with an inner diameter of between approximately 10.9" and 11.1" inches and a wall thickness of between approximately 0.45" and 0.55". Although other shapes, sizes, and thickness of the base outer tubes 46A–46C can be utilized.

Each of the outer corners 48A–48C is somewhat box shaped and includes an outer corner bottom 56, an arched shaped outer corner side 58A, two flat outer corner sides 58B, two attachment outer corner sides 58C, and an outer corner top 60. The outer corner sides 58A–58C extend upwardly from the outer corner bottom 56. The flat outer corner sides 58B and the attachment outer corner sides 58C are planar shaped. Each attachment outer corner side 58C includes a corner side aperture 62. Each outer corner top 60 includes a corner top aperture 64. The outer corner bottom 56 and the outer corner sides 58A–58C of each outer corner 48A–48C are preferably manufactured as a unitary structure for rigidity. The outer corner top is secured to the outer corner sides 58A–58C after the inner frame 36 is assembled and positioned within the outer base 51. The outer corner top 60 can be attached to the outer corner sides 58A–58C by a number of ways. For example, bolts (not shown) can be utilized for ease of assembly and disassembly of the outer frame 34. Alternately, a weld could be utilized.

Preferably, the diameter of the outer tubes 46A–46C, 48A–48C is relatively large so that the outer frame 34 can be built in pieces and then bolted together. With the smaller diameters, welding is often required. This makes the assembled frame difficult to modify.

Each of the side outer tubes 50A–50C has an upper end 66A and a lower end 66B. The shape, size, and thickness of the side outer tubes 50A–50C can be varied to suit the design requirements for the support assembly 12. For example, for an exposure apparatus 10, each of the side outer tubes 50A–50C can have an annular shaped cross-section with an inner diameter of between approximately 10.9" and 11.1" inches, and a wall thickness of between approximately 0.49" and 0.51".Although other shapes, sizes, and thickness of the side outer tubes 50A–50C can be utilized.

As provided above, the three base outer tubes 46A–46C are connected together with the outer corners 48A–48C to form the triangular shaped outer base 51. More specifically, each outer attachment flange 54 of each base outer tube 46A–46C is attached to one of the attachment outer corner sides 58C of the outer corners 48A–48C to form the outer base 51. The outer attachment flange 54 can be attached to the corresponding attachment outer corner side 58C by a number of ways. For example, bolts can be utilized for ease of assembly and disassembly of the outer frame 34. Alternately, a weld could be utilized.

Further, each of the side outer tubes 50A–50C extend upward and substantially vertically from one of the outer corners 48A–48C. More specifically, the lower end 66B of each of the side outer tubes 50A–50C is attached to the outer corner top 60 of one of the outer corners 58A–58C. The lower end 66B can be attached to the corresponding outer corner top 60 by a number of ways. For example, a weld can be utilized. Alternately, bolts can be utilized.

Figure 6A:
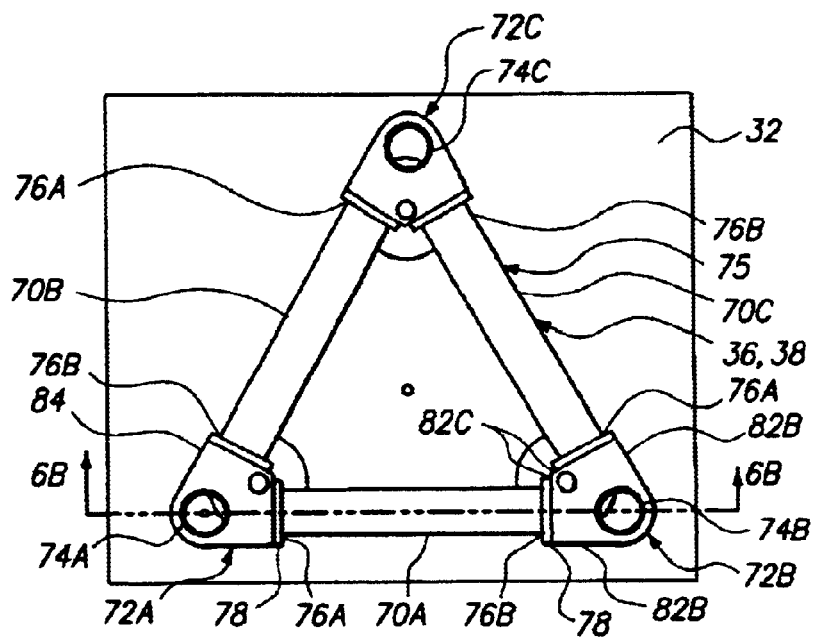
FIG. 6A is a top plan view of an inner frame having features of the present invention.
Figure 6B:
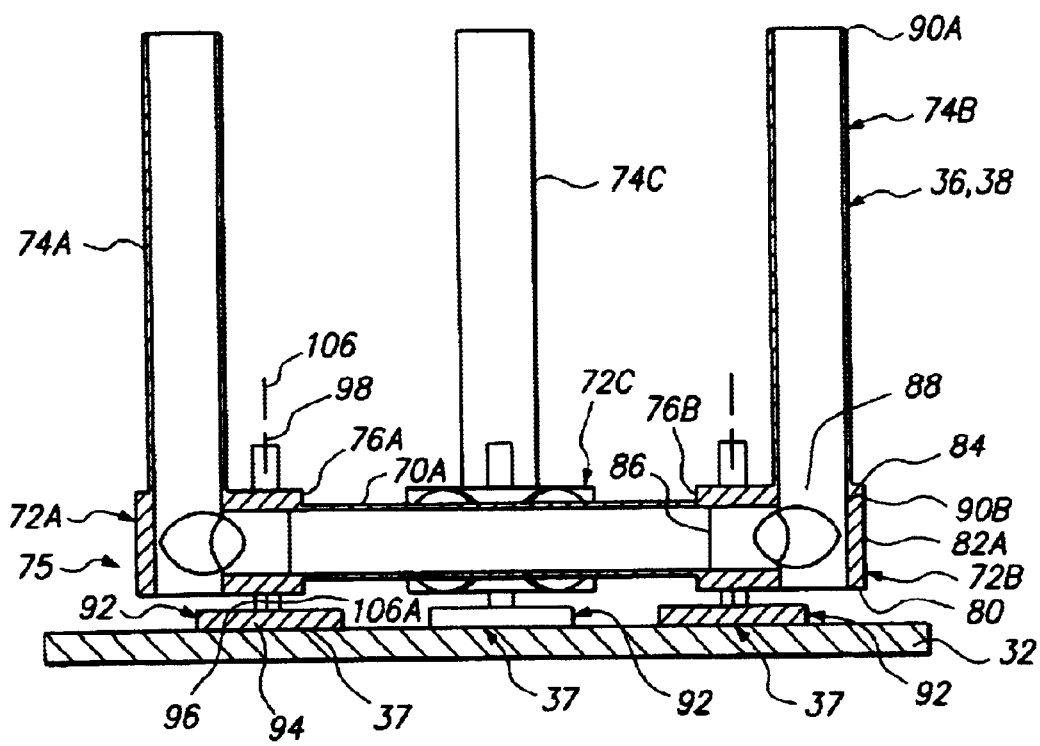
FIG. 6B is a cut-away view taken on line 6B—6B in FIG. 6A.

Referring to FIGS. 4, 6A, and 6B, the inner frame 36 includes (i) a first base inner tube 70A, (ii) a second base inner tube 70B, (iii) a third base inner tube 70C, (iv) a first inner corner 72A, (v) a second inner corner 72B, (vi) a third inner corner 72C, (vii) a first side inner tube 74A, (viii) a second side inner tube 74B, and (ix) a third side inner tube 74C. The three base inner tubes 70A–70C are connected together with the inner corners 72A–72C to form a triangular shaped inner base 75 that is positioned within the outer base 51, e.g. the three base outer tubes 46A–46C and the outer corners 48A–48C. Further, each of the side inner tubes 74A–74C extend upward and substantially vertically from one of the inner corners 72A–72C within the side outer tubes 50A–50C.

Each of the base inner tubes 70A–70C has a first end 76A and an opposed second end 76B. Preferably, each end 76A, 76B of each base inner tube 70A–70C includes an inner attachment flange 78 for ease of assembly of the inner frame 36. The shape, size and thickness of the base inner tubes 70A–70C can be varied to suit the design requirements for the support assembly 12. For example, for an exposure apparatus 10, each of the base inner tubes 70A–70C can have an annular shaped cross-section with an inner diameter of between approximately 6.9" and 7.1" inches and a wall thickness of between approximately 0.49" and 0.51". Although other shapes, sizes and thickness of the base inner tubes 70A–70C can be utilized.

Each of the inner corners 72A–72C is somewhat box shaped and includes an inner corner bottom 80, an arched shaped inner corner side 82A, two flat inner corner sides 82B, two attachment inner corner sides 82C and an inner corner top 84. The inner corner sides 82A–82C extend upwardly from the inner corner bottom 80. The inner corner sides 82B, 82C are planar shaped. Each attachment inner corner side 82C includes a corner side aperture 86. The inner corner top 84 includes a corner top aperture 88. The inner corner bottom 80, the inner corner sides 82A–82C, and the inner corner top 84 are preferably manufactured as a unitary structure for rigidity.

Each of the side inner tubes 74A–74C has an upper end 90A and a lower end 90B. The shape, size, and thickness of the side inner tubes 74A–74C can be varied to suit the design requirements for the support assembly 12. For example, for an exposure apparatus 10, each of side inner tubes 74A–74C can have an annular shaped cross-section with an inner diameter of between approximately 6.9" and 7.1" inches, and a wall thickness of between approximately 0.49" and 0.51". Although other shapes, sizes, and thickness of the side inner tubes 74A–74C can be utilized.

As provided above, the three base inner tubes 70A–70C are connected together with the inner corners 72A–72C to form the triangular shaped inner base 75. More specifically, each inner attachment flange 78 of each base inner tube 70A–70C is attached to one of the attachment inner corner sides 82C of the inner corners 72A–72C to form the inner base 75. The inner attachment flange 78 can be attached to the corresponding attachment inner corner side 82C by a number of ways. For example, bolts (not shown) can be utilized for ease of assembly and disassembly of the inner frame 36. Alternately, a weld could be utilized.

Further, each of the side inner tubes 74A–74C extends upward and substantially vertically from one of the inner corners 72A–72C within one of the side outer tubes 50A–50C. More specifically, the lower end 90B of each of the side inner tubes 74A–74C is attached to the inner corner top 84 of one of the inner corners 72A–72C. The lower end 90B can be attached to the corresponding inner corner top 84 by a number of ways. For example, a weld can be utilized. Alternately, bolts can be utilized.

In summary, with the support assembly 12 provided herein, (i) the first base inner tube 70A is positioned within, spaced apart from, coaxial and concentric with the first base outer tube 46A, (ii) the second base inner tube 70B is positioned within, spaced apart from, coaxial and concentric with the second base outer tube 46B, (iii) the third base inner tube 70C is positioned within, spaced apart from, coaxial and concentric with the third base outer tube 46C, (iv) the first inner corner 72A is positioned within and spaced apart from the first outer corner 48A, (v) the second inner corner 72B is positioned within and spaced apart from the second outer corner 48B, (vi) the third inner corner 72C is positioned within and spaced apart from the third outer corner 48C, (vii) the first side inner tube 74A is positioned within, spaced apart from, coaxial and concentric with the first side outer tube 50A, (viii) the second side inner tube 74B is positioned within, spaced apart from, coaxial and concentric with the second side outer tube 50B, and (ix) a third side inner tube 74C is positioned within, spaced apart from, coaxial and concentric with the third side outer tube 50C. Further, in the embodiment illustrated in the Figures, the side inner tubes 74A–74C are slightly longer than the side outer tubes 50A–50C.

Figure 5C:
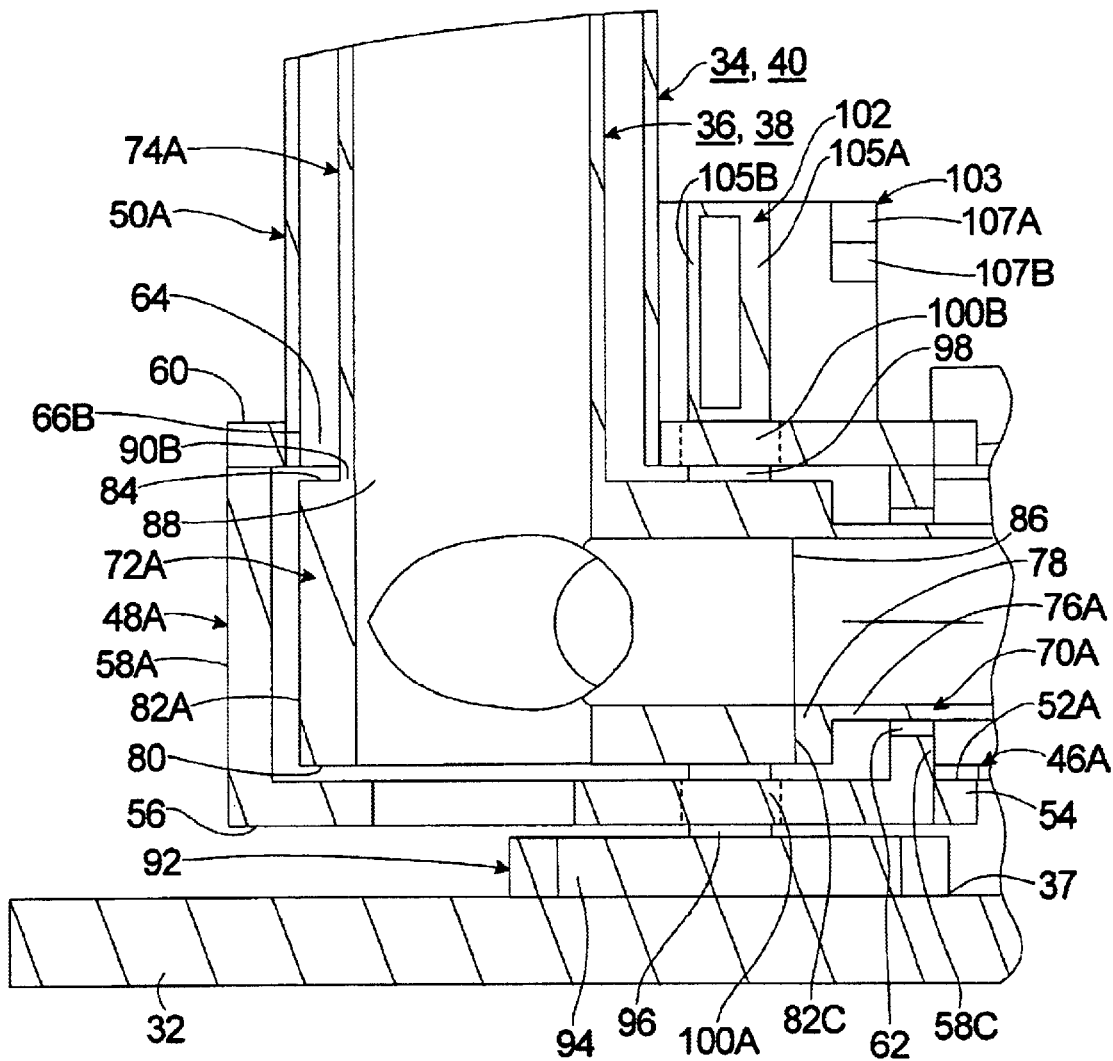
FIG. 5C is an enlarged section view taken on line 5C in FIG. 5B.

Referring to FIGS. 5B and 5C, the support assembly 12 is secured to the mounting base 32 with a plurality of spaced apart mounts 92. The design, number and location of the mounts 92 can be varied. Preferably, as illustrated in the Figures, three mounts 92 secure the inner frame 36 and the outer frame 34 to three mounting locations 37 of the mounting base 32. With this design, the inner frame 36 and the outer frame 34 touch the floor at the same three locations. If this is not the case, the rigidity of the mounting base becomes part of the isolation system. In this embodiment, each mount 92 includes a mounting pad 94, a lower mounting beam 96 and an upper mounting beam 98.

Each mounting pad 94 is disk shaped, contacts the mounting base 32, and is preferably fixedly secured to the mounting base 32. Each lower mounting beam 96 is rod shaped and extends upwardly from the mounting pad 94, and through a lower opening 100A (illustrated in phantom in FIGS. 5B and 5C) in the outer corner bottom 56 of the outer frame 34. The lower mounting beam 96 is fixedly secured to the inner corner bottom 80 of the inner frame 36. With this design, the mounting pad and the lower mounting beam 96 fixedly secure the inner frame 36 to the mounting base 32. Alternately, for example, the outer frame can be secured to the mounting base with one or more vibration isolators (not shown).

Preferably, the outer frame 34 is secured to the inner frame 36 with a plurality of spaced apart, dynamic, frame isolators 102. In the embodiment illustrated in the Figures, the outer frame 34 is secured to the inner frame 36 with three frame isolators 102 (only one is illustrated in FIGS. 5B and 5C). As provided herein, each upper mounting beam 98 extends upwardly from one of the inner corner tops 84 of the inner frame 36 through an upper opening 100B (illustrated in phantom in FIGS. 5B and 5C) in the outer corner top 60 of the outer frame 34. Each of the frame isolators 102 extends between one of the upper mounting beams 98 and the outer frame 34. More specifically, each frame isolator 102 extends between one of the upper mounting beams 98 and a frame box 103 that is secured to the outer frame 34.

The frame isolators 102 reduce the effect of vibration of the inner frame 36 causing vibration on the outer frame 34. Further, the frame isolators 102 isolate the outer frame 34 from the inner frame 36. Each frame isolator 102 can include a pneumatic cylinder 105A that isolates vibration and an actuator 105B that isolates vibration and controls the position with at least two degrees of motion. Suitable frame isolators are sold by Integrated Dynamics Engineering, located in Woburn, Mass.

Preferably, the actuator 105B of each of the frame isolators 102 is a force transducer that adjusts the position of the outer frame 34 relative to the inner frame 36. With the design provided herein, the three frame isolators 102 can adjust the position of the outer frame 34 relative to the inner frame 36, with six degrees of freedom to maintain the relative positions of the components of the machine. With the force transducers there is essentially no change in force as the position changes.

As a result thereof, the frames 34, 36 can be allowed to bend and move, and the frames 34, 36 can be made lighter and/or with less reinforcing.

Additionally, the support assembly 12 can include one or more outer frame position sensors 107A and one or more outer frame accelerometers 107B. The embodiment provided herein utilizes three position sensors 107A (only one is illustrated) and three frame accelerometers 107B (only one is illustrated). More specifically, one position sensor 107A and one frame accelerometer 107B is positioned near each of the frame isolators 102. The outer frame position sensors 107A monitor the position of the outer frame 34 with six degrees of freedom with respect to the mounting base 32, the inner frame 36, and/or the mounting pad 94. The outer frame accelerometers 107B monitor the acceleration of the outer frame 34 with respect to the mounting base 32, the inner frame 36, and/or the mounting pad 94. With this information, the control system 20 can cooperate with the frame isolators 102 to adjust and control the position of the outer frame 34 relative to the mounting base 32, the inner frame 36, and/or the mounting pad 94 with six degrees of freedom. This feature allows the control system 20 to center and elevate the outer frame 34 relative to the inner frame 36, and/or the mounting base 32.

Referring to FIG. 6B, preferably, for each mount 92, a central axis lower beam 104 of the lower mounting beam 96 is aligned with a central axis upper beam 106 of the upper mounting beam 98. This feature allows both frames 34, 36 to be effectively mounted to the same mounting locations 37 on the mounting base 32. This minimizes the influence vibration of the mounting base 32 on the relative positions of the frames 34, 36.

Alternately, other designs of the mounts are possible. For example, the lower mounting beam could be offset from the upper mounting beam for each mount. Still alternately, the outer frame could be mounted to the mounting base completely independent from the inner frame. For example, three inner mounts (not shown) could be used to mount the inner frame to the mounting base, and three separate outer mounts (not shown) could be used to mount the outer frame to the mounting base. However, in these designs, the rigidity of the mounting base becomes part of the isolation system.

Preferably, the outer frame 34 is spaced apart from the inner frame 36 and the outer frame 34 is completely isolated from the mounting base 32 and the inner frame 36.

The inner frame 36 and the outer frame 34 can be made of a number of materials including steel.

It should be noted that the support assembly 12 illustrated in the Figures is generally triangular shaped. More specifically, the outer base 51 and the inner base are triangular shaped. The outer frame 34 includes three spaced apart, side outer tubes 50A–50C, the inner frame 36 includes three spaced apart, side inner tubes 74A–74C, and the support assembly 12 is secured to the mounting base 32 with three mounts 92. Alternately, for example, the outer base and the inner base could be generally rectangular shaped, the support assembly could include four sides, and the support assembly could be secured to the mounting base with four spaced apart mounts. However, in these designs, rigidity of the mounting base again becomes part of the isolation system.

Importantly, with the present design, the quiet components 44 can be easily secured to the outer frame 34. Further, holes 108 can be cut in the outer frame 34 to easily access the inner frame 36. As a result of this design, the control lines 22 that electrically connect the various components of the exposure apparatus 10 can be easily secured to the outer frame 34. This is important because the control lines 22 carry vibration from the control system 20 and any other items they touch on their way to the stage assemblies 14,16 and/or the lens assembly 26.

Figure 7A:
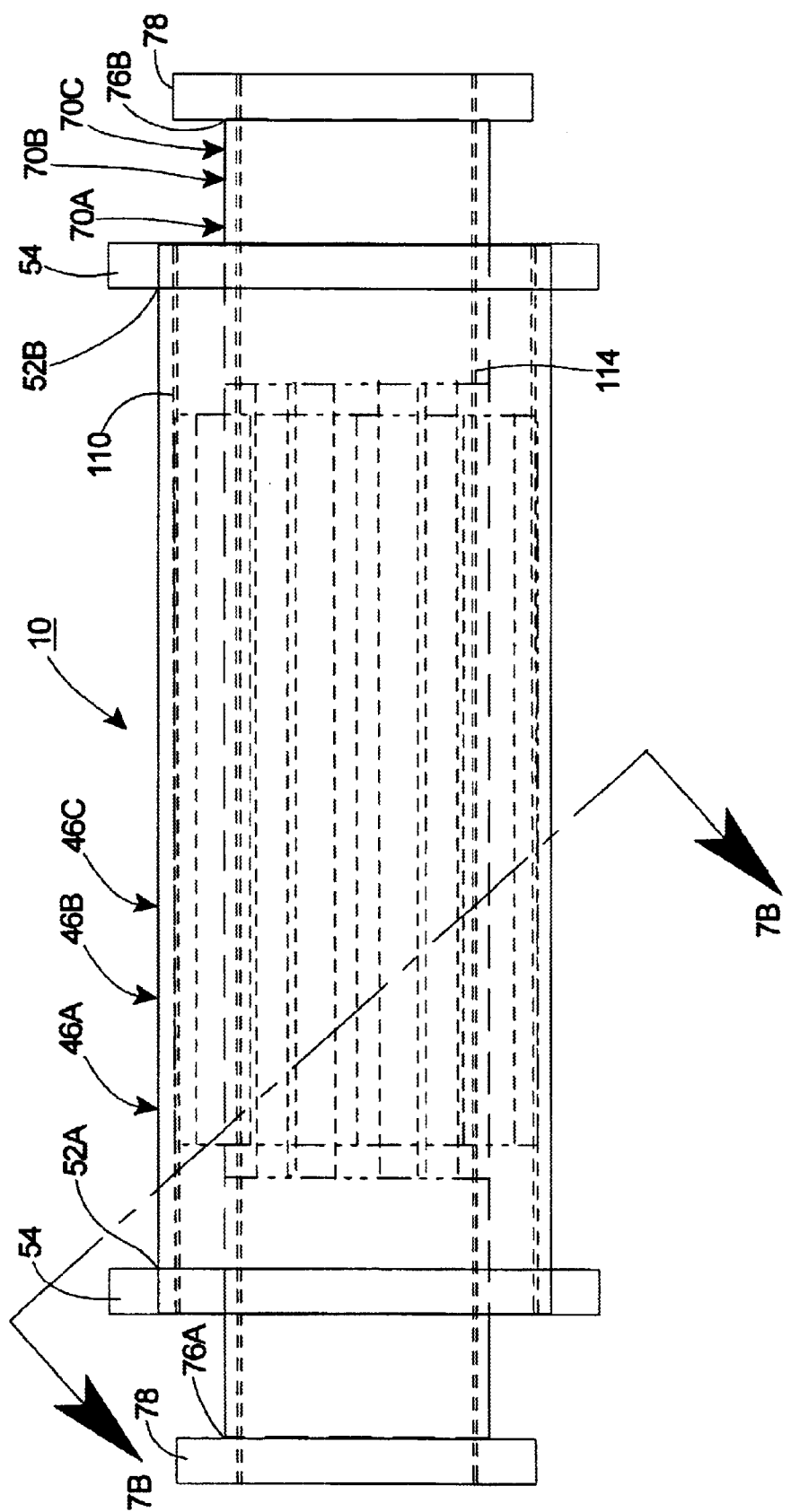
FIG. 7A is a side plan view of another embodiment of a portion of a support assembly.
Figure 7B:
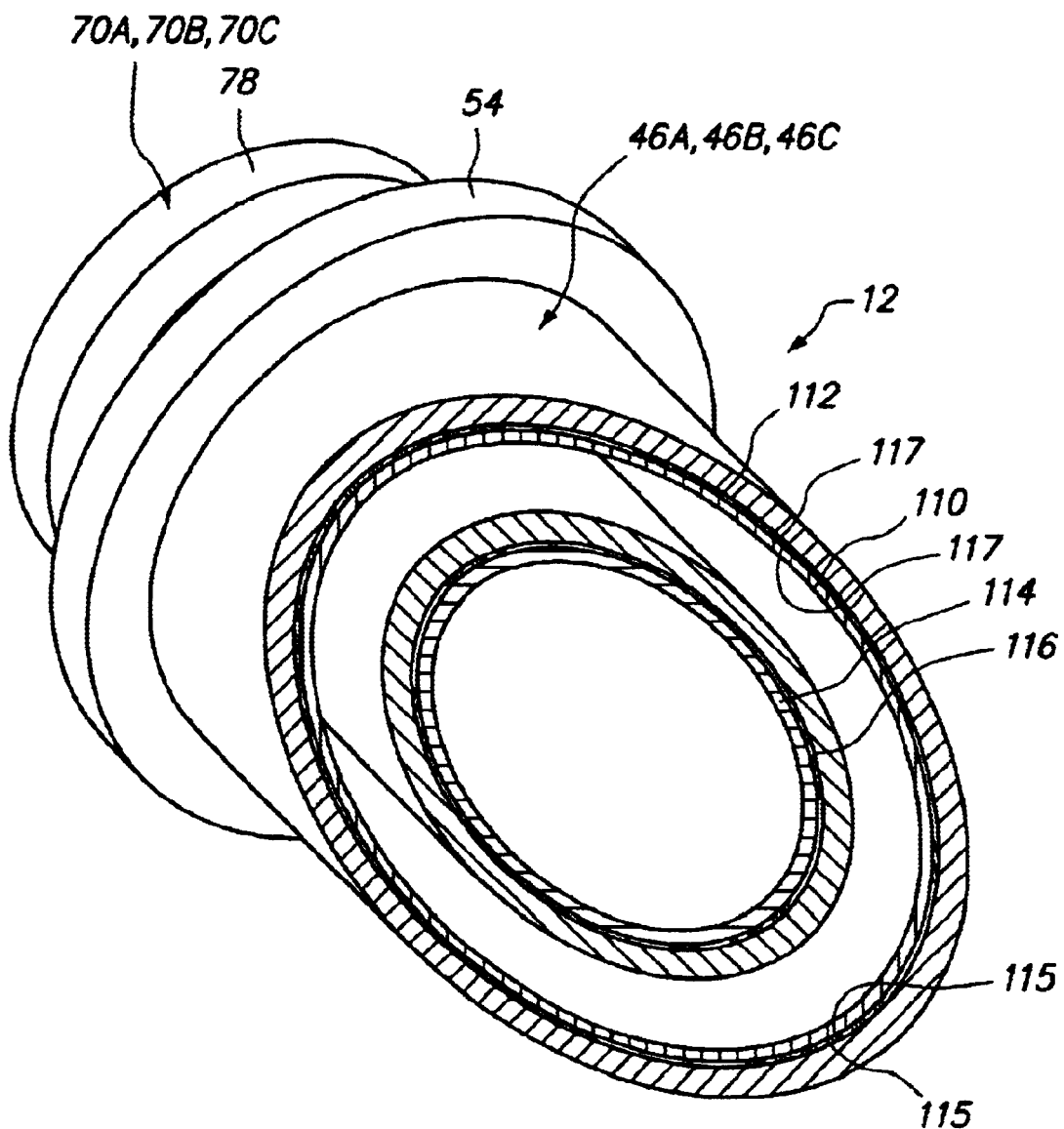
FIG. 7B is a perspective cut-away view taken on line 7B—7B in FIG. 7A.
Figure 7C:
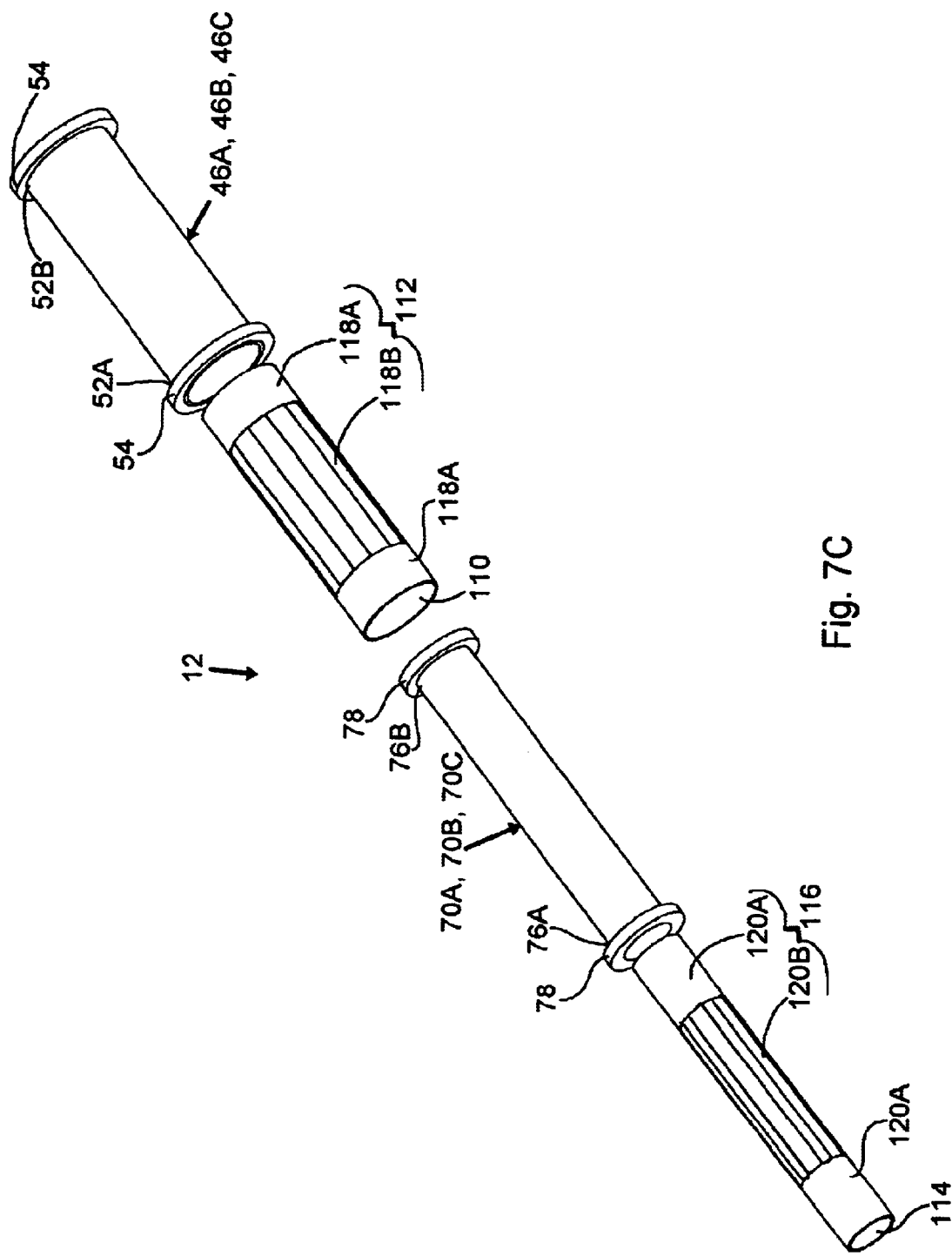
FIG. 7C is an exploded perspective view of the portion of the support assembly of FIG. 7A.

FIGS. 7A–7C illustrate an alternate embodiment of a portion of the support assembly 12. In particular, FIG. 7A illustrates a side plan view, with hidden lines, of a portion of the support assembly 12, FIG. 7B illustrates a perspective cut-away view of a portion of the support assembly 12 taken on line 7B–7B in FIG. 7A, and FIG. 7C illustrates an exploded perspective view of the portion of the support assembly 12.

FIGS. 7A–7C illustrate the combination of only one of the base outer tubes 46A–46C, and only one of the base inner tubes 70A–74C. In this embodiment, the tubes 46A–46B, 70A–70C are dampened and constrained from bending and torsion flexing. More specifically, in this design, the base outer tube 46A–46C includes an outer constraining tube 110 positioned inside the base outer tube 46A–46C, and an outer dampener 112 positioned between the base outer tube 46A–46C and the outer constraining tube 110. The base outer tube 46A–46C and the outer constraining tube 110 are preferably concentric and coaxial.

Somewhat similarly, the base inner tube 70A–70C includes an inner constraining tube 114 positioned inside the base inner tube 70A–70C, and an inner dampener 116 positioned between the base inner tube 70A–70C and the inner constraining tube 114. The base inner tube 70A–70C and the inner constraining tube 114 are preferably concentric and coaxial.

The outer dampener 112 is preferably secured to the base outer tube 46A–46C and the outer constraining tube 110 with an adhesive 115. The inner dampener 116 is preferably secured to the base inner tube 70A–70C and the inner constraining tube 114 with an adhesive 117.

In this embodiment each constraining tube 110, 114 can be a thin gage material having a tube wall thickness of between approximately 0.20" and 0.5", and more preferably approximately 0.25 inches. Each dampener 112, 116 can has a thickness of between approximately 0.05" and 0.20", and more preferably approximately 0.1 inches, although another thickness can be utilized.

The dampener 112, 116 is preferably a resilient material and not a liquid at operating temperature. The outer dampener 112, 116 can be molded out of SWEDAC DG-U6, sold by Kuriyama Corp., located at 12–14, Nishinakajima 1-Chome, Yodogawa-ku, Osaka 532-0011, Japan.

Referring to FIGS. 7B and 7C, the outer dampener 112 includes two annular outer bands 118A, and six outer longitudinal strips 118B. Each of the outer bands 118A is positioned near one of the ends of the outer constraining tube 110. The outer bands 118A dampen torsion vibration in shear. The outer longitudinal strips 118B extend longitudinally between the outer bands 118A. The outer longitudinal strips 118B dampen bending vibration in shear.

Somewhat similarly, referring to FIGS. 7B 7C, the inner dampener 116 includes two annular inner bands 120A, and six inner longitudinal strips 120B. Each of the inner bands 120A is positioned near one of the ends of the inner constraining tube 114. The inner bands 120A dampen torsion vibration in shear. The inner longitudinal strips 120B extend longitudinally between the inner bands 120A. The inner longitudinal strips 120B dampen bending vibration in shear.

Importantly, with the teachings provided herein, the support assembly 12 could be built with one or more of the outer tubes 46A–46C, and 50A–50C having a design similar to the one base outer tube 46A–46C illustrated in FIGS. 7A–7C. Additionally, with the teachings provided herein, the support assembly 12 could be built with one or more of the inner tubes 70A–70C, 74A–74C having a design similar to the base inner tube 70A–70C illustrated in FIGS. 7A–7C. Moreover, the support assembly could be built with only the outer frame including the constraining tubes or only the inner frame including the constraining tubes.

The first stage assembly 14 holds and positions the reticle 28 relative to the lens assembly 26 and the device 30. The second stage assembly 16 holds and positions the device 30 with respect to the projected image of the illuminated portions of the reticle 28.

The design of the first stage assembly 14 and the components of the first stage assembly 14 can be varied to suit the design requirements of the machine. For example, in the embodiment illustrated in FIGS. 1–3B, the first stage assembly includes a first stage base 122, a first stage 124 and a first stage mover assembly 126. In this design, the first stage 124 moves relative to the first stage base 122 along the Y axis and about the Z axis. More specifically, the first stage mover assembly 126 moves and positions the first stage 124 along the Y axis and about the Z axis under the control of the control system 20. Alternately, for example, the first stage assembly could be designed with a first stage that is movable relative to the first stage base by the first stage mover assembly along the X axis, along the Y axis, along the Z axis, about the X axis, about the Y axis and/or about the Z axis.

The first stage base 122 guides and supports the first stage 124. The design of the first stage base 122 can be varied to suit the design requirements of the first stage assembly 14. In the embodiment illustrated in FIGS. 1–3B, the first stage base 122 includes (i) a front brace 128, (ii) a rear brace 130 spaced apart from the front brace 128, (iii) a left base guide 132 that extends between the braces 128, 130, and (iv) a right base guide 134 that is spaced apart from the left base guide 132 and extends between the braces 128, 130. The first stage base 122 defines an opening that allows the energy beam (not shown) to pass from the reticle 28 to the lens assembly 26. Each of the base guides 132, 134 include a "L" shaped guide surface 136 that is used to guide the movement of the first stage 124.

The first stage base 122 is typically a quiet component 44 and is preferably secured to the quiet frame 40, with a plurality of spaced apart, dynamic, first base isolators 138. The first base isolators 138 reduce the effect of vibration of the quiet frame 40 causing vibration on the first stage base 122. Typically, three or four spaced apart, first base isolators 138 can be used. Each first base isolator 138 can include a pneumatic cylinder (not shown) and an actuator (not shown). Suitable base isolators are sold by Integrated Dynamics Engineering, located in Woburn, Mass.

Preferably, the first base isolators 138 utilize force transducers (not shown) to adjust the position of the first stage base 122 relative to the lens assembly 26 or some other location to maintain the relative positions of the components of the machine. Additionally, the first stage assembly 14 can include one or more first stage base sensors (not shown) that monitor the position of the first stage base 122 with respect to the lens assembly 26 and/or some other location. With this information, the control system 20 can cooperate with the first base isolators 138 to adjust and control the position of the first stage base 122 relative to the lens assembly 26.

In the embodiment illustrated in the FIGS. 1–3B, the braces 128, 130 are secured with three spaced apart first base isolators 138 to a QF upper mount 140. The QF upper mount 140 is a flat plate that is shaped somewhat similar to a "U". The QF upper mount 140 is secured to the upper end 66A of each of the side outer tubes 50A–50C of the outer frame 34. Thus, in this embodiment, the first stage base 122 is supported above the mounting base 32 by the quiet frame 40. Additionally, because the first stage base 122 supports the first stage 124, the outer frame 34 also supports the first stage 124 above the mounting base 32.

In the embodiment illustrated in FIGS. 1–3B, the first stage 124 includes a first stage frame 142, a portion of the first stage mover assembly 126, and a first holder 143. In this design, the first stage frame 142 includes (i) a generally planar shaped stage bottom 144, (ii) a frame aperture that extends through the stage bottom 144, (iii) a pair of spaced apart, generally "L" shaped, stage sides 146 that extend upwardly from the stage bottom 144, and (iv) a pair of spaced apart, rectangular shaped, mover brackets 148 that cantilever and extend away from the stage sides 146.

The stage sides 146 are positioned near the base guides 132. In this embodiment, the first stage frame 142 includes a plurality of spaced apart, fluid outlets (not shown), and a plurality of spaced apart, fluid inlets (not shown) positioned near the base guides 132. Pressurized fluid (not shown) is released from the fluid outlets towards the guide surfaces 136 of the base guides 132, and a vacuum is pulled in the fluid inlets to create a vacuum preload type fluid bearing between the first stage 124 and first stage base 122. The vacuum preload type fluid bearing maintains the first stage 124 spaced apart along the X axis and along the Z axis relative to the first stage base 122, and allows for motion of the first stage 124 along the Y axis and about the Z axis relative to the first stage base 122.

Alternately, the first stage 124 can be supported spaced apart from the first stage base 122 by other ways. For example, a magnetic type bearing or roller type bearing could be utilized that allows for motion of the first stage 124 relative to the first stage base 122.

The first holder 143 retains the reticle 28 during processing. The design of the first holder 143 can be varied. For example, the first holder 143 can be a vacuum chuck, an electrostatic chuck, or some other type of clamp. The first holder 143 is secured to the first stage frame 142.

The first stage mover assembly 126 moves and positions the first stage 124 relative to the first stage base 122 along the Y axis and about the Z axis. The design of the first stage mover assembly 126 can be varied to suit the movement requirements of the first stage assembly 14. For example, the first stage mover assembly 126 can include one or more rotary motors, voice coil motors, linear motors, electromagnetic actuators, and/or some other type of force actuators.

In the embodiment illustrated in FIGS. 1–3B, the first stage mover assembly 126 includes a pair of spaced apart upper Y movers 150 and a reaction mass assembly 152. In this embodiment, each upper Y mover 150 is a commutated, linear motor that includes a stage component 154 and an adjacent reaction component 156 that interacts with the stage component 154. The stage component 154 of each upper Y mover 150 is secured to the first stage frame 142, moves with the first stage frame 142 and is part of the first stage 124. In contrast, the reaction component 156 of each upper Y mover 150 is secured to the reaction mass assembly 152.

In this design, each of the stage components 154 move relative to the corresponding reaction component 156 of each upper Y mover 150. Stated another way, the stage component 154 and the reaction component 156 of each upper Y mover 150 interact to selectively move the first stage 124 along the Y axis and about the Z axis relative to the first stage base 122. In this embodiment, one of the components 154, 156 of each upper Y mover 150 includes one or more magnet arrays (not shown) and the other component 154, 156 of each upper Y mover 150 includes one or more conductor arrays (not shown).

Electrical current (not shown) is individually supplied to each conductor (not shown) in each conductor array of each upper Y mover 150 by the control system 20. For each upper Y mover 150, the electrical current in each conductor interacts with a magnetic field (not shown) generated by one or more of the magnets in the magnet array. This causes a force (Lorentz force) between the conductors and the magnets that can be used to move the first stage 124 relative to the first stage base 122.

Importantly, the reaction component 156 of each upper Y mover 150 generates a reaction force and is coupled to the reaction frame 38, e.g. the inner frame 36. As a result thereof, the reaction forces from the upper Y movers 150 can be transferred to the mounting base 32 without influencing the position of the first stage 124 and the quiet frame 40.

The reaction mass assembly 152 reduces and minimizes the amount of reaction forces from the upper Y movers 150 that is transferred to the reaction frame and the mounting base 32. In the embodiment illustrated in FIGS. 1–3B, the reaction mass assembly 152 includes a first reaction mass 158A, a second reaction mass 158B, and a reaction base 160. In this embodiment, the reaction masses 158A, 158B are free to move along the Y axis relative to the reaction base 160. The reaction masses 158A, 158B are supported above and guided during movement along the reaction base 160 by a fluid bearing, a roller bearing, a magnetic bearing, or some other type of guide.

Through the principle of conservation of momentum, movement of the first stage 124 with the upper Y movers 150 along the Y axis in one direction, moves the reaction masses 158A, 158B of the reaction mass assembly 152 in the opposite direction along the Y axis. With this design, the reaction forces from the first stage mover assembly 126 are negated. This inhibits the reaction forces from the first stage mover assembly 126 from significantly influencing the position of the reaction frame 38.

Each reaction mass 158A, 158B is generally rectangular shaped and includes a somewhat rectangular shaped channel. In this embodiment, the reaction component 156 of each of the upper Y movers 150 is positioned within the channel and is secured to the reaction masses 158A, 158B.

The reaction base 160 supports the reaction masses 158A, 158B. In the embodiment illustrated in FIGS. 1–3, the reaction base 160 is a flat plate that is shaped somewhat similar to a "U". The reaction base 160 is secured to the upper end 90A of each of the side inner tubes 74A–74C of the inner frame 36. Thus, in this embodiment, the reaction mass assembly 152 and the reaction component 156 of each upper Y mover 150 is supported above the mounting base 32 by the reaction frame 38.

Additionally, the reaction mass assembly can include one or more trim movers (not shown) that make minor corrections to the position of the reaction masses relative to the reaction base.

Figure 8:
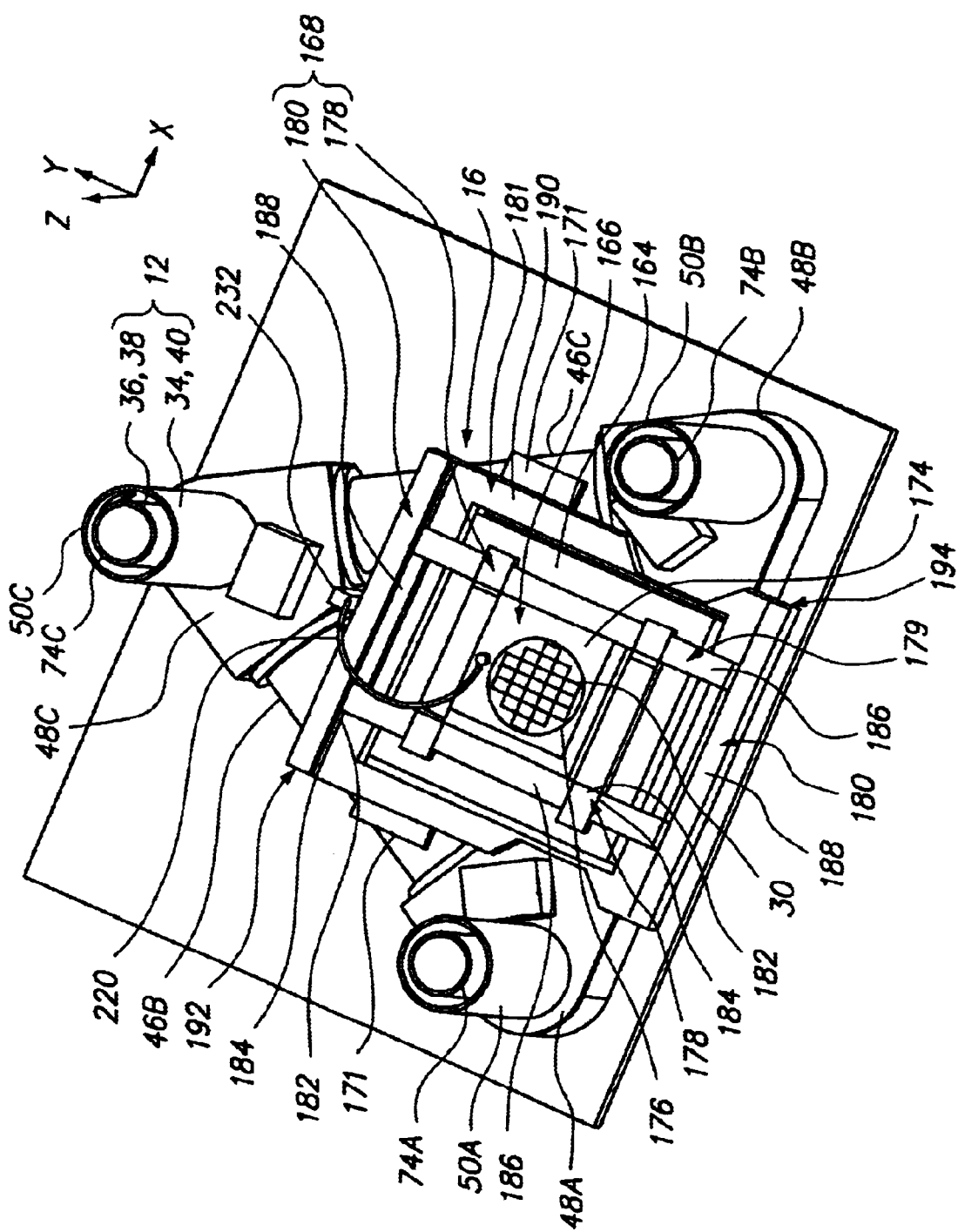
FIG. 8 is a perspective top view of the support assembly and a stage assembly having features of the present invention.

The design of the second stage assembly 16 and the components of the second stage assembly 16 can be varied to suit the design requirements of the machine. For example, FIG. 8 illustrates a top plan view of a second stage assembly 16 along with the support assembly 12. In this embodiment, the second stage assembly 16 includes a wafer table base 164, a Y stage 166, a wafer table 174, an X stage 179, an X stage base 181, and a second stage mover assembly 168. In this design, the wafer table 174 moves relative to the wafer table base 164 along the Y axis, along the X axis, and about the Z axis. More specifically, the second stage mover assembly 168 moves and positions the X stage 179 and the Y stage 166 under the control of the control system 20.

The wafer table base 164 guides and supports the wafer table 174. The design of the wafer table base 164 can be varied to suit the design requirements of the second stage assembly 16. In the embodiment illustrated in the Figures, the wafer table base 164 is generally flat plate shaped. The wafer table base 164 is typically a quiet component 44 and is preferably secured to the quiet frame 40.

Referring to FIGS. 4, 5A, and 8, the wafer table base 164 (not shown in FIG. 4) is secured to the outer frame 34 with a front base isolator 170, a pair of side base isolators 171, and a base crossbeam 172. The front base isolator 170 is secured to the first base outer tube 46A while the side base isolators 171 are secured to the second base outer tube 46B and the third base outer tube 46C, respectively. Thus, in this embodiment, the wafer table base 164 is supported above the mounting base 32 by the outer base 51 of the quiet frame 40. Additionally, because the wafer table base 174 supports the wafer table 164, the outer frame 34 also supports the wafer table 174 above the mounting base 32.

The base isolators 170, 171 reduce the effect of vibration of the quiet frame causing vibration on the wafer table base. Each base isolator 170, 171 can include a pneumatic cylinder that isolates vibration, and an actuator that isolates vibration and controls the position with at least two degrees of freedom. Suitable base isolators 170, 171 are sold by Integrated Dynamics Engineering, located in Woburn, Mass.

Preferably, the base isolators 170, 171 utilize force transducers (not shown) to adjust the position of the wafer stage base 164 relative to the outer frame 34 to maintain the relative positions of the components of the machine. Additionally, the second stage assembly 16 can include one or more sensors (not shown) that monitor the position of the wafer stage base 164 with respect to the mounting base and/or the outer frame 34. With this information, the control system 20 can cooperate with the base isolators 170, 171 to adjust and control the position of the wafer stage base 164 relative to the mounting base 32.

In the embodiment illustrated in FIG. 8, the wafer table 174 includes a second holder 176, and the wafer table 174 includes a plurality of spaced apart, fluid outlets (not shown), and a plurality of spaced apart, fluid inlets (not shown) directed towards the wafer table base 164. Pressurized fluid (not shown) is released from the fluid outlets towards the wafer table base 164, and a vacuum is pulled in the fluid inlets to create a vacuum preload type, fluid bearing between the wafer table 174 and the wafer table base 164. The vacuum preload type, fluid bearing maintains the wafer table 174 spaced apart along the Z axis relative to the wafer table base 164 and allows for motion of the wafer table 174 along the Y axis, along the X axis and, about the Z axis relative to the wafer table base 164.

Alternately, the wafer table 174 can be supported spaced apart from the wafer table base 164 by other ways. For example, a magnetic type bearing or roller type bearing could be utilized that allows for motion of the wafer table relative to the wafer table base.

The second holder 176 retains the device 30 during processing. The design of the second holder 176 can be varied. For example, the second holder 176 can be a vacuum chuck, an electrostatic chuck, or some other type of clamp.

The X stage 179 is generally rectangular frame shaped and includes a pair of spaced apart sides 186 and a pair of spaced apart ends 188. The X stage base 181 is rectangular frame shaped and includes an X base top 190, a first channel 192, and a second channel 194 that extend above the X base top 190. In this embodiment, the X stage 179 includes a plurality of spaced apart, fluid outlets (not shown) and a plurality of spaced apart, fluid inlets (not shown) directed towards the X base top 190. Pressurized fluid (not shown) is released from the fluid outlets towards the X base top 190, and a vacuum is pulled in the fluid inlets to create a vacuum preload type, fluid bearing between the X stage 179 and X stage base 181. The vacuum preload type, fluid bearing maintains the X stage 179 spaced apart along the Z axis relative to the X stage base 181 and allows for motion of the X stage 179 along the X axis and about the Z axis relative to the X stage base 181.

The second stage mover assembly 168 moves and positions the X stage 179 and the Y stage 166 relative to the X stage base 181. The design of the second stage mover assembly 168 can be varied to suit the movement requirements of the second stage assembly 16. For example, the second stage mover assembly 168 can include one or more rotary motors, voice coil motors, linear motors, electromagnetic actuators, and/or some other type of force actuators.

In the embodiment illustrated in Figures, the second mover assembly 168 includes a pair of spaced apart lower Y movers 178 (illustrated in phantom), a pair of spaced apart lower X movers 180 (illustrated in phantom), and four spaced apart table movers 183 (illustrated in phantom). In this embodiment, each lower mover 178, 180 is a commutated, linear motor that includes a first component 182 (illustrated in phantom) and an adjacent reaction component (not shown) that interacts with the respective first component 182.

The first component 182 of each lower Y mover 178 is secured to the Y stage 166, moves with the Y stage 166 and is part of the Y stage 166. In contrast, the reaction component of each lower Y mover 178 is secured to and moves with the X stage 179. Stated another way, the first component 182 and the corresponding reaction component of each lower Y mover 178 interact to selectively move the Y stage 166 along the Y axis and about the Z axis relative to the X stage 179. In this embodiment, one of the components of each lower Y mover 178 includes one or more magnet arrays (not shown) and the other component of each lower Y mover 178 includes one or more conductor arrays (not shown).

Electrical current (not shown) is individually supplied to each conductor (not shown) in each conductor array of each lower Y mover 178 by the control system 20. For each lower Y mover 178, the electrical current in each conductor interacts with a magnetic field (not shown) generated by one or more of the magnets in the magnet array. This causes a force (Lorentz force) between the conductors and the magnets that can be used to move the Y stage 166 relative to the X stage 179.

Somewhat similarly, the first component 182 of each lower X mover 180 is secured to the X stage 179, moves with the X stage 179, and is part of the X stage 179. In contrast, the reaction component of each lower X mover 180 is secured to the X stage base 181. In this design, each of the first components 182 move relative to the corresponding reaction components 184 of each lower X mover 180. Stated another way, the first component 182 and the reaction component of each lower X mover 180 interact to selectively move the X stage 179 along the X axis relative to the X stage base 181. In this embodiment, one of the components of each lower X mover 180 includes one or more magnet arrays (not shown) and the other component of each lower X mover 180 includes one or more conductor arrays (not shown).

Electrical current (not shown) is individually supplied to each conductor (not shown) in each conductor array of each lower X mover 180 by the control system 20. For each lower X mover 180, the electrical current in each conductor interacts with a magnetic field (not shown) generated by one or more of the magnets in the magnet array. This causes a force (Lorentz force) between the conductors and the magnets that can be used to move the X stage 179 relative to the X stage base 181.

Importantly, the reaction component of each lower mover 178, 180 generates a reaction force and is coupled to the reaction frame 38, e.g. the inner frame 36. More importantly, the reaction forces of the table movers 183 are coupled through the lower movers 178, 180 to the reaction frame 38, e.g. the inner frame 36. As a result there of, the reaction forces from the lower movers 178, 180 and the table movers 183 can be transferred to the mounting base 32 without influencing the position of the wafer table 174 and the quiet frame 40.

More specifically, referring to FIGS. 4 and 8, the X stage base 181 is secured to the inner frame 36 with a front brace 196 and a cross brace 198. The front brace 196 is secured to the first base inner tube 70A and extends through the hole 108 in the first base outer tube 46A. The cross brace 198 is a somewhat "U" shaped beam that is secured between the second base inner tube 70B and the third base inner tube 70C. The cross brace 198 extends through holes 108 in the second left base outer tube 46B and the third right base outer tube 46C. Thus, the holes 108 can be cut in the outer frame 34 to easily access the inner frame 36.

The table movers 183 cooperate to move and position the wafer table 174 along the X axis, along the Y axis, and about the two axis relative to the wafer table base 164. Importantly, the Y stage 166 and the X stage 179 do not touch the wafer table 174. The Y stage 166 and the X stage 179 follow the wafer table 174 and carry a portion of the table movers 183. The position of the Y stage 166 and the X stage 179 have no influence on the position of the wafer table 174.

The measurement system 18 monitors the position of the first stage 124, and the wafer table 174 relative to the lens assembly 26. With this information, the first stage mover assembly 126 can be used to precisely position the first stage 124 and the table movers 183 can be used to precisely position of the wafer table 174. Alternately, the measurement system 18 can be referenced to some other location that allows for reference to the focused image.

The design of the measurement system 18 can be varied. For example, the measurement system 18 can utilize one or more laser interferometers, encoders, and/or other measuring devices to monitor the position of the stages 124, 166 relative to the lens assembly 26. In the embodiment illustrated in FIGS. 1–3B, the measurement system 18 includes a laser interferometer system having an upper block 200, an upper stage mirror (not shown), and an upper reference mirror (not shown). The upper block 200 is secured to the lens assembly 26. The upper stage mirror is secured to the first stage 124 near the first holder 143. The upper reference mirror is secured to the lens assembly 26 near where the first stage 124 positions the reticle 28.

The upper block 200 interacts with the upper stage mirror and the upper reference mirror to monitor the location of the first stage 124 along the Y axis and about the Z axis (theta Z). More specifically, the upper block 200 generates (i) a pair of spaced apart measurement beam 202 that are directed towards and reflected off of the upper stage mirror, and (ii) a pair of spaced apart reference beam 204 that are directed towards and reflected off of the upper reference mirror. By detecting these beams, the location of the first stage 124 along the Y axis and about the Z axis relative to the lens assembly 26 can be monitored.

Further, the measurement system 18 includes a laser interferometer system having an X block 206, an YZ block 208, an X stage mirror (not shown), an X reference mirror (not shown), an YZ stage mirror (not shown), and an YZ reference mirror (not shown). The X block 206 and the YZ block 208 are secured to the lens assembly 26. The X stage mirror and the YZ stage mirror are secured to the wafer table 174 near the second holder 176. The X reference mirror and the YZ reference mirror are secured to the lens assembly 26 near where the wafer table 174 positions the device 30.

The X block 206 interacts with the X stage mirror and the X reference mirror to monitor the location of the wafer table 174 along the X axis. The YZ block 208 interacts with the YZ stage mirror and the YZ reference mirror to monitor the location of the wafer table 174 along the Y axis and about the Z axis (theta Z). More specifically, the X block 206 generates (i) a pair of spaced apart measurement beam 210 that are directed towards and reflected off of the X stage mirror, and (ii) a pair of spaced apart reference beam 212 that are directed towards and reflected off of the X reference mirror. By detecting these beams, the location of the wafer table 174 along the X axis relative to the lens assembly 26 can be monitored. Somewhat similarly, the YZ block 208 generates (i) a pair of spaced apart measurement beam 214 that are directed towards and reflected off of the YZ stage mirror, and (ii) a pair of spaced apart reference beam 216 that are directed towards and reflected off of the YZ reference mirror. By detecting these beams, the location of the wafer table 174 along the Y axis and about the Z axis relative to the lens assembly 26 can be monitored.

The control system 20 controls the first stage mover assembly 126 to precisely position the first stage 124, and the table movers 183 to precisely position the wafer table 174. More specifically, the control system 20 controls the first stage mover assembly 126 to position the first stage 124 along the Y axis and about the Z axis relative to the lens assembly 26. Similarly, the control system 20 controls the table movers 183 to position the wafer table 174 along the X axis, along the Y axis and about the Z axis relative to the lens assembly 26.

In the embodiment illustrated in the Figures, the control system 20 directs and controls the current to stage component 154 for each of the upper Y movers 150 to control movement of the first stage 124. Somewhat similarly, the control system 20 directs and controls the current to the table movers 183 to control movement of the wafer table 174.

Figure 9:
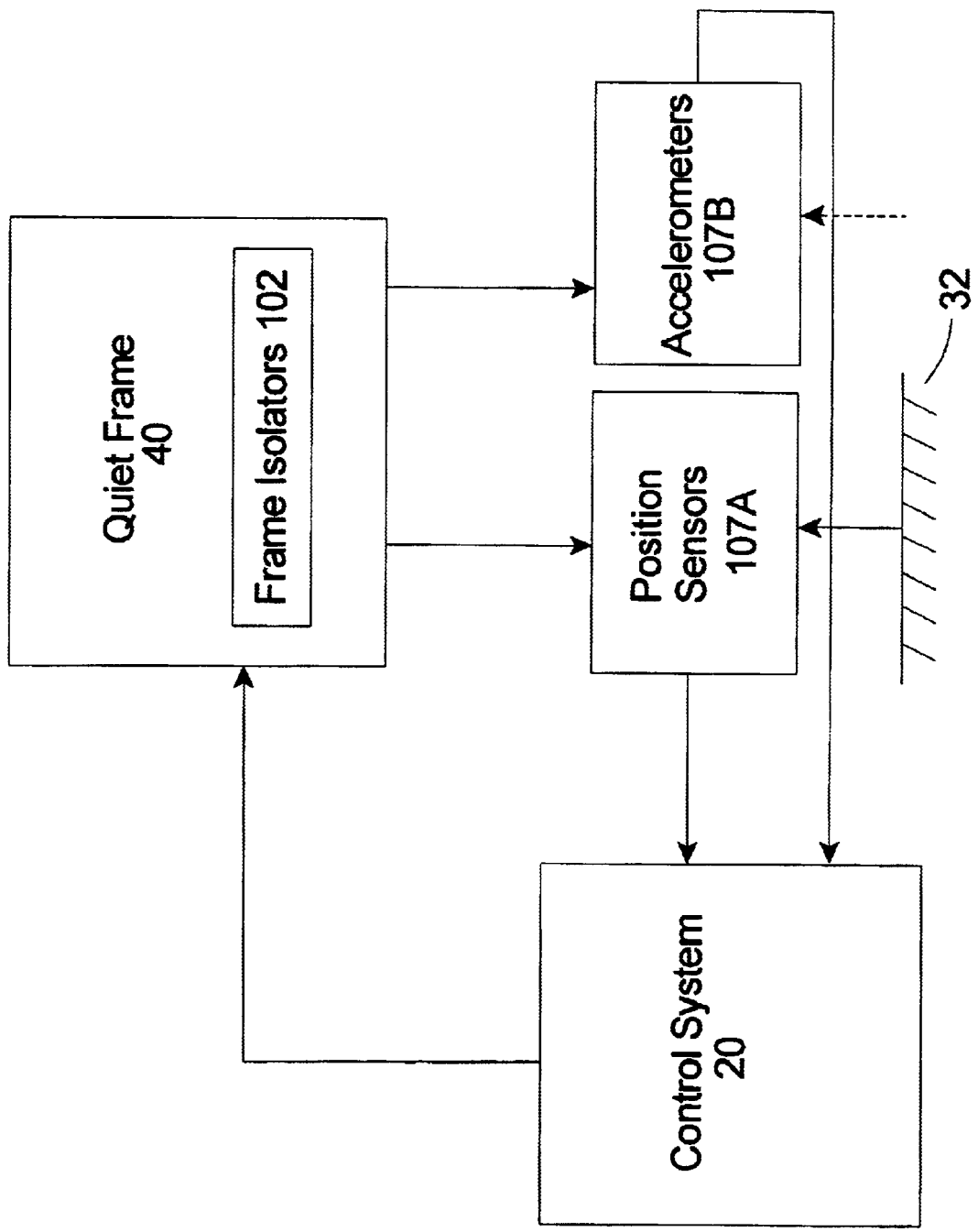
FIG. 9 is a simplified block diagram that illustrates the operation of a control system having features of the present invention.

Additionally, as described in FIG. 9, the control system 20 preferably controls the position the outer frame 34 relative to the inner frame 36 and/or the mounting base 32. In particular, information from the position sensors 107A and the frame accelerometers 107B is directed to the control system 20. With this information, the control system 20 can direct current to the frame isolators 102 to adjust and control the position of the outer frame 34 relative to the mounting base 32 and/or the mounting pad 94 with six degrees of freedom. This feature allows the control system 20 to center, elevate and isolate the outer frame 34 relative to the inner frame 36, and or the mounting base 32.

The control lines 22 extend between and electrically connect the control system 20 and the various components of the exposure apparatus 10. Because of the design provided herein, the control lines 22 can easily be secured to the quiet frame 40. This is important because the control lines 22 carry vibration from the control system 20, and any other items they touch, on their way to the respective component of the exposure apparatus 10. However, as outlined below, the control lines 22 that are electrically connected to the quiet components 44 should be connected to the quiet frame 40. Alternately, the control lines 22 that are electrically connected to noisy components 42 may not need to be connected to the quiet frame 40.

Figure 3A:
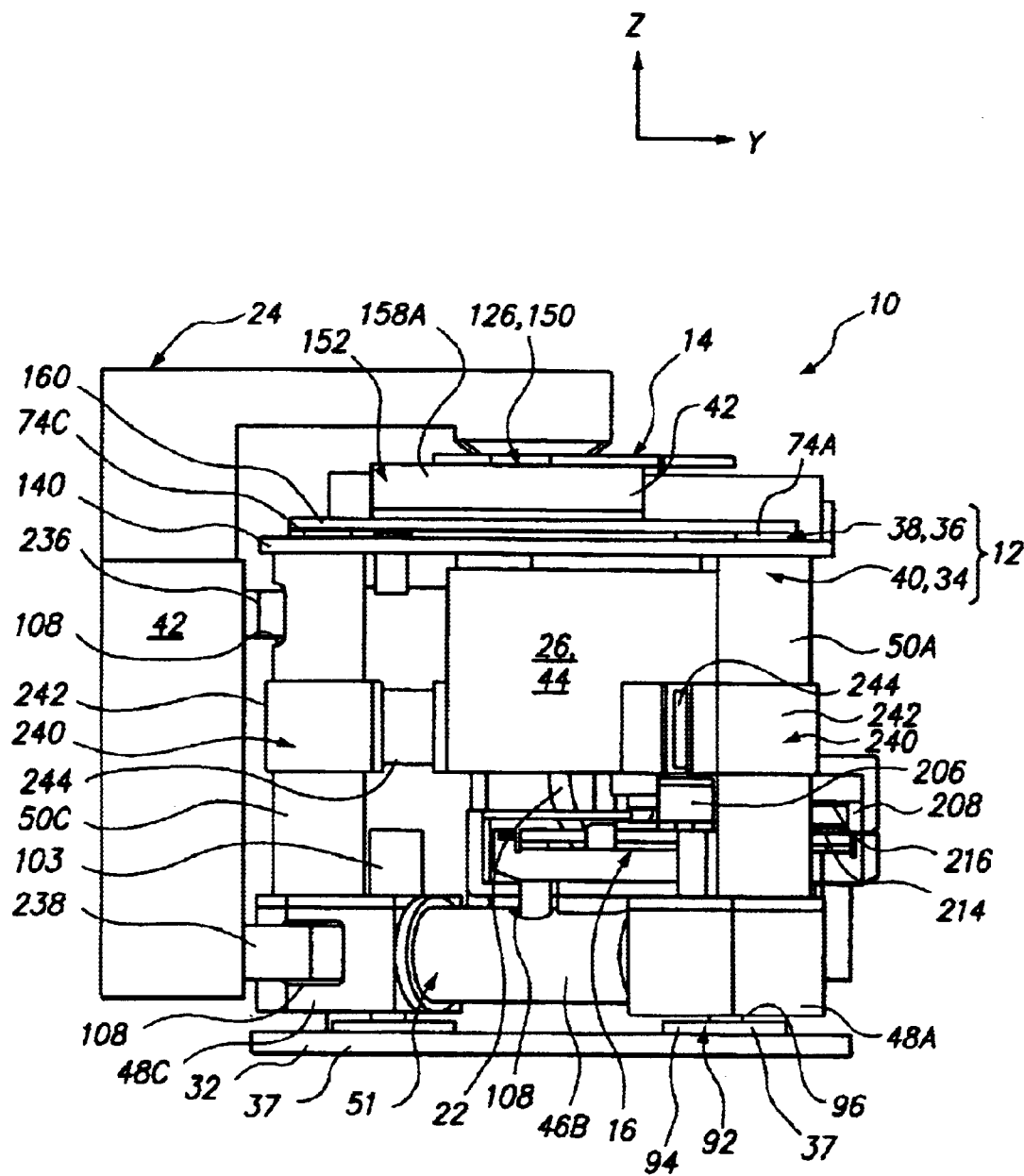
FIG. 3A is a left side plan view of the exposure apparatus of FIG. 1.
Figure 3B:
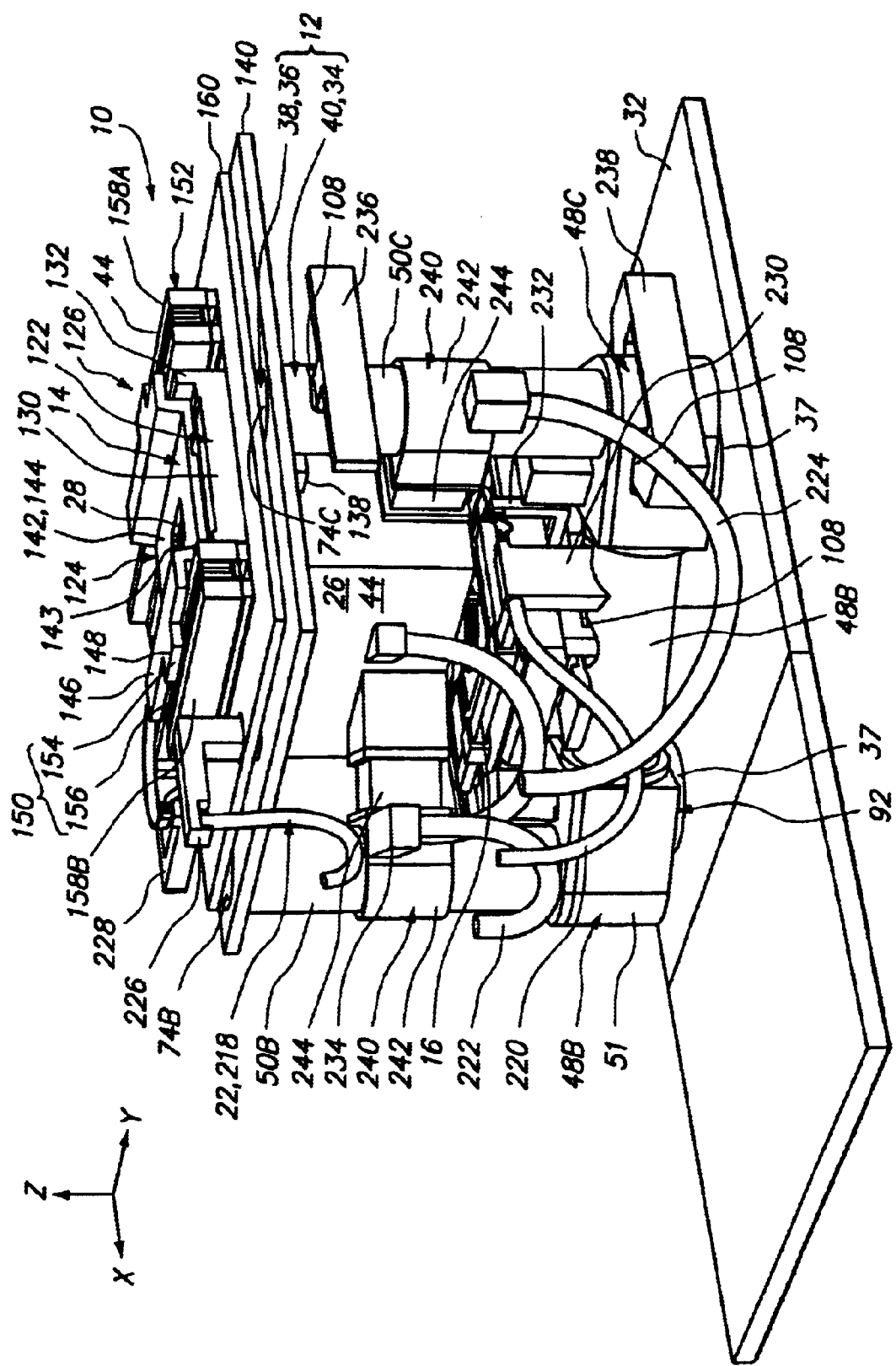
FIG. 3B is a right side perspective view of a portion of the exposure apparatus of FIG. 1.

FIGS. 1, 2, and 3B illustrate (i) a FS control line 218, (ii) a SS control line 220, (iii) a LA control line 222, and (iv) an IS control line 224. However, these are only examples of control lines 22 that may be necessary for the exposure apparatus 10. In fact, many additional control lines between the exposure apparatus 10 and the control system 20 are typically necessary. Preferably, each control line 22 that electrically connects a quiet component 44 is secured to the quiet frame 40 in multiple locations to minimize the vibration that is carried in the control line 22 to the respective component of the exposure apparatus 10.

Referring to FIGS. 1, 2, and 3B, the FS control line 218 extends between and electrically connects the first stage assembly 14 to the control system 20. The FS control line 218 is secured to the outer frame 34 with a first FS bracket 226 and a second FS bracket 228. Each FS bracket 226, 228 is generally "L" shaped. The first FS bracket 226 is secured to the QF upper mount 140 and extends through a hole in the reaction base 160. The second FS bracket 228 is secured to the right base guide 134 of the first stage base 122. With this design, the FS control line 218 is secured to the quiet frame 40 and next to the isolated right base guide 134 to further isolate vibrations from the system entering the first stage 124.

The SS control line 220 extends between and electrically connects the second stage assembly 16 to the control system 20. The SS control line 220 is secured to the outer frame 34 with a first SS bracket 230 and a second SS bracket 232. The first SS bracket 230 is secured to the third outer base tube 46C. The second SS bracket 232 is secured to the wafer stage base 164. With this design, the SS control line 220 is secured to the quiet frame 40 and next to the isolated right base guide 134 to further isolate vibrations from the system entering the first stage assembly 14.

As a result thereof, the quiet frame 40 reduces vibration from the control system 20 at the first SS bracket 230 and further reduces vibration at the second SS bracket 232. This design significantly lowers vibration of the SS control line 220 prior to attachment to the wafer table 174.

The LA control line 222 extends between and electrically connects the lens assembly 26 to the control system 20. The LA control line 222 is secured to the outer frame 34 with a first LA bracket 234. In this embodiment, the first LA bracket 234 is secured to the second side outer tube 50B.

The IS control line 224 extends between and electrically connects the illumination system 24 to the control system 20. The illumination system 24 is considered to be a noisy component 42. Because the illumination system 24 is mounted to the reaction frame 38 as provided below, it is not necessary to connect the IS control line 224 to the quiet frame 40. Stated another way, the IS control line 224 is not secured to the quiet frame 40.

Referring back to FIGS. 1–3B, the exposure apparatus 10 is particularly useful as a lithographic device that transfers a pattern (not shown) of an integrated circuit from the reticle 28 onto the device 30, e.g. the semiconductor wafer. The exposure apparatus 10 mounts to the mounting base 32. The mounting base 32 can be the ground, a base, or floor or some other supporting structure.

The illumination system 24 includes an illumination source 239 (illustrated in phantom in FIG. 2) and an illumination optical assembly 237 (illustrated in phantom in FIG. 2). The illumination source 239 emits a beam (irradiation) of light energy. The illumination optical assembly 237 guides the beam of light energy from the illumination source 239 to above the lens assembly 26. The beam illuminates selectively different portions of the reticle and exposes the wafer.

As can best be seen with reference to FIGS. 3A and 3B, the illumination system 24 is a noisy component 42 and is secured to the inner frame 36 with an upper IS bracket 236 and a lower IS bracket 238. The upper IS bracket 236 is "T" shaped. The upper IS bracket 236 is attached to the third side inner tube 74C and extends through a hole 108 is the third side outer tube 50C. The lower IS bracket 238 is secured at two locations to the third inner corner 72C and extends through two holes 108 in the third outer corner 48C. Alternately, for example, the illumination system 24 can be secured to the mounting base 32.

The lens assembly 26 projects and/or focuses the light passing through the reticle to the wafer. Depending upon the design of the exposure apparatus 10, the lens assembly 26 can magnify or reduce the image illuminated on the reticle.

In the embodiment illustrated in the Figures, the lens assembly 26 is a quiet component 44 and is secured to the outer frame 34 with three spaced a part lens mounts 240. Each lens mount 240 extends between the outer frame 34 and the lens assembly 26. More specifically, each lens mount 240 extends between one of the side outer tubes 50A–50C and the lens assembly 26. In the embodiment illustrated in the figures, each lens mount 240 includes a side mount 242 and a lens isolator 244. The side mount 242 fits around one of the side outer tubes 50A–50C. Each lens isolator 244 reduces the effect of vibration of the quiet frame 40 causing vibration on the lens assembly 26. Each lens isolator 244 can be a two axis vibration and lift actuator including a pneumatic cylinder (not shown) and an actuator (not shown). Suitable lens isolators are sold by Integrated Dynamics Engineering, located in Woburn, Mass.

Preferably, the lens isolators 244 utilize force transducers (not shown) to adjust the position of the lens assembly 26 relative to the outer frame 34 to maintain the relative positions of the components of the machine. Additionally, the lens assembly 26 can include one or more lens sensors (not shown) that monitor the position of the lens assembly 26 with respect to the mounting base 32 and/or the outer frame 34. With this information, the control system 20 can cooperate with the lens isolators 244 to adjust and control the position of the lens assembly 26 relative to the mounting base 32.

As provided above, the first stage assembly 14 holds and positions the reticle relative to the lens assembly 26 and the device 30. Similarly, the second stage assembly 16 holds and positions the device 30 with respect to the projected image of the illuminated portions of the reticle 28. Depending upon the design, the exposure apparatus 10 can also include additional motors to move the stages 14, 16.

There are a number of different types of lithographic devices. For example, the exposure apparatus 10 can be used as scanning type photolithography system that exposes the pattern from the reticle onto the wafer with the reticle and wafer moving synchronously. In a scanning type lithographic device, the reticle is moved perpendicular to an optical axis of the lens assembly 26 by the first stage assembly 14, and the wafer is moved perpendicular to an optical axis of the lens assembly 26 by the second stage assembly 16. Scanning of the reticle and the wafer occurs while the reticle and the wafer are moving synchronously.

Alternately, the exposure apparatus 10 can be a step-and-repeat type photolithography system that exposes the reticle while the reticle and the wafer are stationary. In the step and repeat process, the wafer is in a constant position relative to the reticle and the lens assembly 26 during the exposure of an individual field. Subsequently, between consecutive exposure steps, the wafer is consecutively moved by the second stage perpendicular to the optical axis of the lens assembly 26 so that the next field of the wafer is brought into position relative to the lens assembly 26 and the reticle for exposure. Following this process, the images on the reticle are sequentially exposed onto the fields of the wafer so that the next field of the wafer is brought into position relative to the lens assembly 26 and the reticle.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines, and disk drives.

The illumination source 239 can be g-line (436 nm), i-line (365 nm), KrF excimer laser (248 nm), ArF excimer laser (193 nm), and $F_2$ laser (157 nm). Alternately, the illumination source 239 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the lens assembly 26 included in the photolithography system, the lens assembly 26 need not be limited to a reduction system. It could also be a 1x or magnification system.

With respect to a lens assembly 26, when far ultra-violet rays such as the excimer laser is used, glass materials such as quartz and fluorite that transmit far ultra-violet rays is preferable to be used. When the $F_2$ type laser or x-ray is used, the lens assembly 26 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377, as well as Japan Patent Application Disclosure No. 10-3039 and its counterpart U.S. patent application Ser. No. 873,605 (Application Date: Jun. 12, 1997), also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications, are incorporated herein by reference.

Further, in photolithography systems, when linear motors (see U.S. Pat. Nos. 5,623,853 and/or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage which uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either one of the magnet unit or the armature coil unit is connected to the stage, and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. 5,874,820 and published Japanese Patent Application Disclosure No. 8-330224. As far as is permitted, the disclosures in U.S. Pat. Nos. 5,528, 118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections, and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 10:
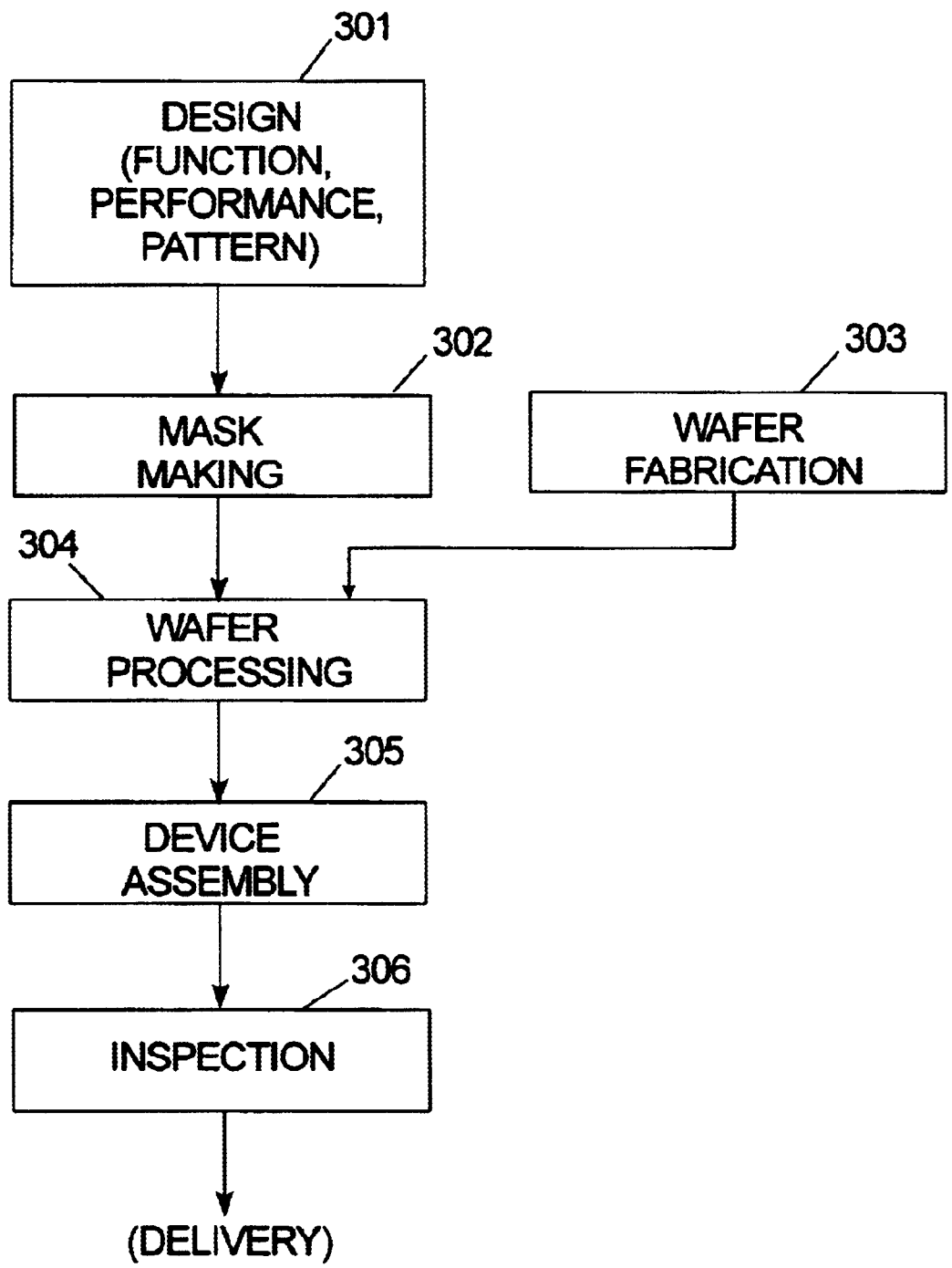
FIG. 10 is a flow chart that outlines a process for manufacturing a device in accordance with the present invention.

Further, semiconductor devices can be fabricated using the above described systems, by the process shown generally in FIG. 10. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process, and packaging process), then finally the device is inspected in step 306.

Figure 11:
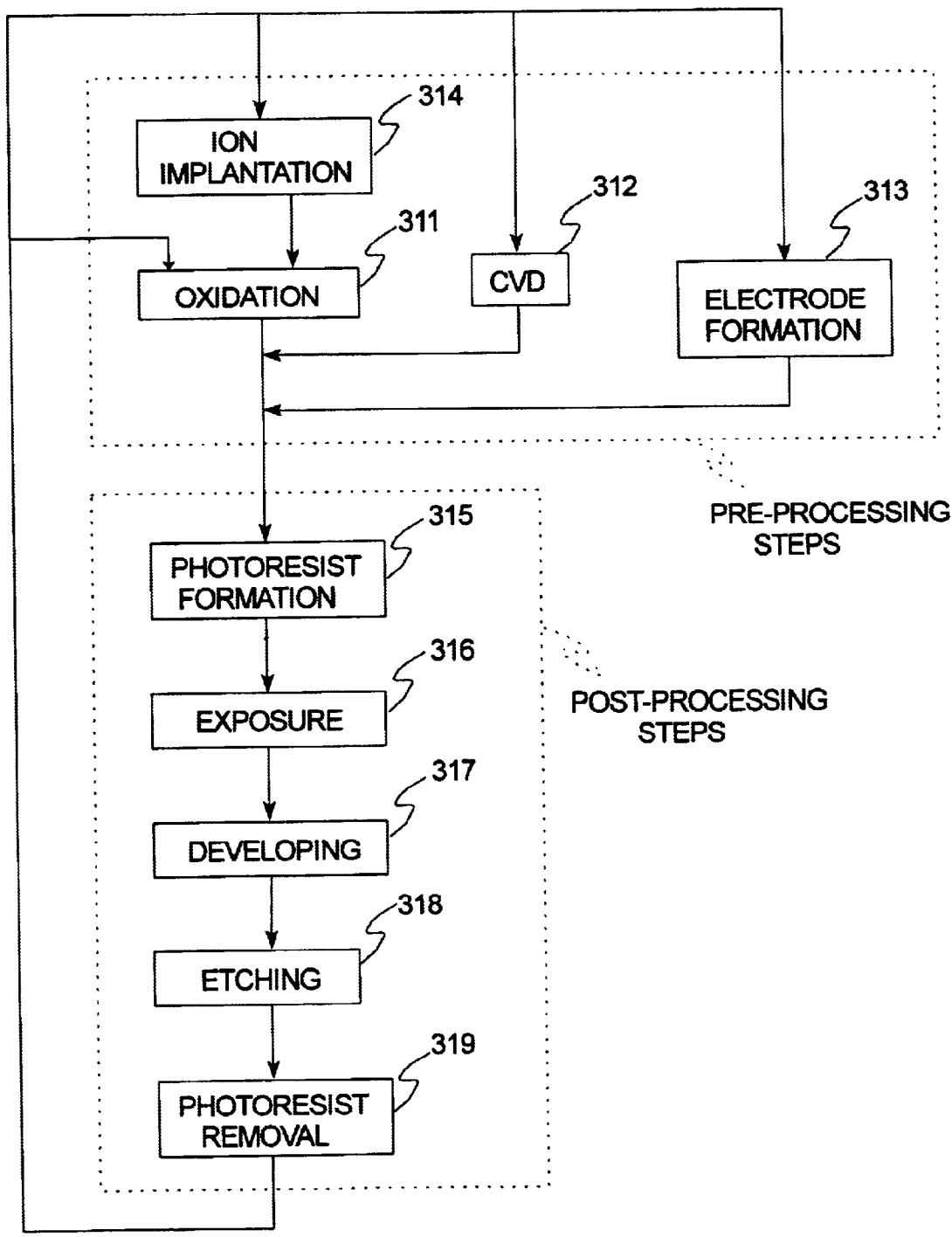
FIG. 11 is a flow chart that outlines device processing in more detail.

FIG. 11 illustrates a detailed flowchart example of the above-mentioned step 304 in the case of fabricating semiconductor devices. In FIG. 11, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311-314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then, in step 317 (developing step), the exposed wafer is developed. In step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular exposure apparatus 10 and the support assembly 12 as shown and disclosed herein are fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A support assembly that is adapted for supporting a stage assembly, the stage assembly including at least a first component and a second component, the support assembly comprising:
    a first tube being adapted to support at least one of the components of the stage assembly;
    a constraining tube that is positioned near the first tube and extends along at least a portion of the first tube; and
    a dampener that is positioned between the first tube and the constraining tube, the dampener being secured to both the first tube and the constraining tube to connect the constraining tube to the first tube.

2. The support assembly of claim 1 wherein the constraining tube is substantially coaxial with the first tube.

3. The support assembly of claim 1 wherein the dampener is secured to the first tube and the constraining tube with an adhesive.

4. The support assembly of claim 1 including an outer tube that encircles the first tube, an outer constraining tube positioned within the outer tube, and an outer dampener positioned between and connecting the outer tube and the outer constraining tube.

5. The support assembly of claim 1 including an inner tube positioned with the constraining tube, an inner constraining tube positioned within the inner tube, and an inner dampener positioned between and connecting the inner tube and the inner constraining tube.

6. The support assembly of claim 1 including an outer frame for supporting the first component and an inner frame for supporting the second component, the inner frame being positioned within a portion of the outer frame.

7. The support assembly of claim 6 wherein the first tube is a part of the outer frame.

8. The support assembly of claim 7 wherein the first tube is a part of the inner frame.

9. The support assembly of claim 6 wherein the outer frame and the inner frame are secured to a mounting base at approximately the same mounting location.

10. The support assembly of claim 6 wherein the outer frame includes an outer tube, an outer constraining tube and an outer dampener, the outer constraining tube being positioned within the outer tube, and the outer dampener being positioned between and connecting the outer tube and the outer constraining tube.

11. The support assembly of claim 6 wherein the inner frame includes an inner tube, an inner constraining tube and an inner dampener, the inner constraining tube being positioned within the inner tube, and the inner dampener being positioned between the inner tube and the inner constraining tube.

12. An apparatus including a stage assembly and the support assembly of claim 6.

13. The apparatus of claim 12 wherein the stage assembly includes a quiet component that is secured to the outer frame.

14. The apparatus of claim 12 wherein the stage assembly includes a noisy component that is secured to the inner frame.

15. The apparatus of claim 12 wherein the stage assembly includes a stage base, a stage and a mover that moves the stage relative to the stage base, the mover including a reaction component.

16. The apparatus of claim 15 wherein the stage base is secured to the outer frame and the reaction component is secured to the inner frame.

17. The apparatus of claim 12 wherein the inner frame is adapted to transfer reaction forces from the stage assembly to a mounting base.

18. An exposure apparatus including the apparatus of claim 12.

19. The exposure apparatus of claim 18 including a quiet component that is secured to the outer frame and a noisy component that is secured to the inner frame.

20. The exposure apparatus of claim 18 including a lens assembly, an illumination system and a control line, wherein the lens assembly and the control line are secured to the outer frame and the illumination system is secured to the inner frame.

21. The exposure apparatus of claim 18 including a control system that controls the position of the outer frame relative to the mounting base.

22. A method for making a support assembly for supporting a stage assembly, the stage assembly including at least a first component and a second component, the method comprising the steps of:
providing a first tube for supporting at least one of the components of the stage assembly;
providing a constraining tube that is positioned near the first tube and extends along at least a portion of the first tube; and
providing a dampener that is positioned between the first tube and the constraining tube, the dampener being secured to both the first tube and the constraining tube to connect the constraining tube to the first tube.

23. The method of claim 22 including the step of positioning the constraining tube substantially coaxial with the first tube.

24. The method of claim 22 including the step of securing the dampener to the first tube and the constraining tube with an adhesive.

25. The method of claim 22 including the steps of (i) providing an outer tube that encircles the first tube, (ii) providing an outer constraining tube positioned within the outer tube, and (iii) providing an outer dampener positioned between and connecting the outer tube and the outer constraining tube.

26. The method of claim 22 including the steps of (i) providing an inner tube positioned with the constraining tube, (ii) providing an inner constraining tube positioned within the inner tube, end (iii) providing an inner dampener positioned between and connecting the inner tube and the inner constraining tube.

27. A method for making an exposure apparatus that forms an image on a wafer, the method comprising the steps of:
providing an irradiation apparatus that irradiates the wafer with radiation to form the image on the wafer; and
providing the support assembly made by the method of claim 22.

28. A method of making a water including the steps of providing a substrate and transferring an image to the substrate with the exposure apparatus made by the method of claim 27.

29. A method of making a device including the steps of providing a substrate and transferring an image to the substrate with the exposure apparatus made by the method of claim 27.

30. A support assembly that is adapted for supporting a stage assembly, the stage assembly including at least a first component and a second component, the support assembly comprising:
an outer frame being adapted to support the first component of the stage assembly, the outer frame including an outer tube; and
an inner frame being adapted to support the second component of the stage assembly, the inner frame being positioned within a portion of the outer frame, the inner frame including an inner tube that is positioned within the outer tube.

31. The support assembly of claim 30 wherein the inner tube is substantially coaxial with the outer tube.

32. The support assembly of claim 30 wherein the inner tube is substantially concentric with the outer tube.

33. An apparatus including a stage assembly and the support assembly of claim 30.

34. A support assembly that is adapted for supporting a stage assembly, the stage assembly including at least a first component and a second component, the support assembly comprising:
an outer frame being adapted to support the first component of the stage assembly, the outer frame including a first side outer tube, a second side outer tube, and a third side outer tube; and
an inner frame being adapted to support the second component of the stage assembly, the inner frame being positioned within a portion of the outer frame, the inner frame including a first side inner tube, a second side inner tube, and a third side inner tube.

35. The support assembly of claim 34 wherein (i) the first side inner tube is positioned within the first side outer tube, (ii) the second side inner tube is positioned within the second side outer tube, and (iii) the third side inner tube is positioned within the third side outer tube.

36. An apparatus including a stage assembly and the support assembly of claim 34.

37. A support assembly that is adapted for supporting a stage assembly, the stage assembly including at least a first component and a second component, the support assembly comprising:

an outer frame being adapted to support the first component of the stage assembly, the outer frame including an outer base having a base outer tube; and an inner frame being adapted to support the second component of the stage assembly, the inner frame being positioned within a portion of the outer frame, the inner frame including an inner base that is positioned within the outer base, the inner base including a base inner tube that is positioned within the base outer tube.

38. An apparatus including a stage assembly and the support assembly of claim 37.

39. A support assembly that is adapted for supporting a stage assembly, the stage assembly including at least a first component and a second component, the support assembly comprising:

an outer frame being adapted to support the first component of the stage assembly, the outer frame including an outer base having a first base outer tube, a second base outer tube and a third base outer tube; and an inner frame being adapted to support the second component of the stage assembly, the inner frame being positioned within a portion of the outer frame, the inner frame including an inner base that is positioned within the outer base, the inner base includes a first base inner tube, a second base inner tube and a third base inner tube.

40. The support assembly of claim 39 wherein (i) the first base inner tube is positioned within the first base outer tube, (ii) the second base inner tube is positioned within the second base outer tube, and (iii) the third base inner tube is positioned within the third base outer tube.

41. The support assembly of claim 40 wherein (i) the outer frame includes a first side outer tube, a second side outer tube, and a third side outer tube, and the inner frame includes a first side inner tube, a second side inner tube, and a third side inner tube, and (ii) wherein the first side inner tube is positioned within the first side outer tube, the second side inner tube is positioned within the second side outer tube, and the third side inner tube is positioned within the third side outer tube.

42. An apparatus including a stage assembly and the support assembly of claim 39.

43. A support assembly that is adapted for supporting a stage assembly, the stage assembly including at least a first component and a second component, the support assembly comprising:

an outer frame being adapted to support the first component of the stage assembly;

an inner frame being adapted to support the second component of the stage assembly, the inner frame being positioned within a portion of the outer frame; and a mount that secures the outer frame and the inner frame to a mounting base, wherein the mount includes a lower mounting beam and an upper mounting beam, the lower and upper mounting beams connecting the inner frame to the mounting base, wherein a central axis of the lower mounting beam is substantially in line with central axis of the upper mounting beam.

44. An apparatus including a stage assembly and the support assembly of claim 43.

45. A support assembly that is adapted for supporting a stage assembly, the stage assembly including at least a first component and a second component, the support assembly comprising:

an outer frame being adapted to support the first component of the stage assembly, the outer frame including an outer tube, an outer constraining tube, and an outer dampener, the outer constraining tube being positioned within the outer tube and the outer dampener being positioned between the outer tube and the outer constraining tube; and an inner frame being adapted to support the second component of the stage assembly, the inner frame being positioned within a portion of the outer frame.

46. The support assembly of claim 45 wherein the inner frame includes an inner tube, an inner constraining tube, and an inner dampener, the inner constraining tube being positioned within the inner tube and the inner dampener being positioned between the inner tube and the inner constraining tube.

47. An apparatus including a stage assembly and the support assembly of claim 45.

48. A support assembly that is adapted for supporting a stage assembly, the stage assembly including at least a first component and a second component, the support assembly comprising:

an outer frame being adapted to support the first component of the stage assembly; and an inner frame being adapted to support the second component of the stage assembly, the inner frame being positioned within a portion of the outer frame, the inner frame including an inner tube, an inner constraining tube, and an inner dampener, the inner constraining tube being positioned within the inner tube and the inner dampener being positioned between the inner tube and the inner constraining tube.

49. An apparatus including a stage assembly and the support assembly of claim 48.

50. A method for making a support assembly for supporting a stage assembly, the stage assembly including a first component and a second component, the method comprising the steps of:

providing an outer frame to support the first component, the outer frame including an outer tube; and providing an inner frame to support the second component, the inner frame being positioned within a portion of the outer frame, the inner frame including an inner tube that is positioned within the outer tube.

51. A method for making an exposure apparatus that forms an image on a wafer, the method comprising the steps of:

providing an irradiation apparatus that irradiates the wafer with radiation to form the image on the wafer; and providing the support assembly made by the method of claim 50.

52. A method for making a support assembly for supporting a stage assembly, the stage assembly including a first component and a second component, the method comprising the steps of:

providing an outer frame to support the first component, the outer frame including a first side outer tube, a second side outer tube, and a third side outer tube; and providing an inner frame to support the second component, the inner frame being positioned within a portion of the outer frame, the inner frame including a first side inner tube, a second side inner tube, and a third side inner tube; wherein (i) the first side inner tube is positioned within the first side outer tube, (ii) the second side inner tube is positioned within the second side outer tube, and (iii) the third side inner tube is positioned within the third side outer tube.

53. A method for making an exposure apparatus that forms an image on a wafer, the method comprising the steps of:

providing an irradiation apparatus that irradiates the wafer with radiation to form the image on the wafer; and providing the support assembly made by the method of claim 52.

54. A method for making a support assembly for supporting a stage assembly, the stage assembly including a first component and a second component, the method comprising the steps of:

providing an outer frame to support the first component, the outer frame including an outer base, the outer base having a first base outer tube, a second base outer tube and a third base outer tube; and providing an inner frame to support the second component, the inner frame being positioned within a portion of the outer frame, the inner frame including an inner base that is positioned within the outer base, the inner base including a first base inner tube, a second base inner tube, and a third base inner tube; wherein (i) the first base inner tube is positioned within the first base outer tube, (ii) the second base inner tube is positioned within the second base outer tube, and (iii) the third base inner tube is positioned within the third base outer tube.

55. A method for making an exposure apparatus that forms an image on a wafer, the method comprising the steps of:

providing an irradiation apparatus that irradiates the wafer with radiation to form the image on the wafer; and providing the support assembly made by the method of claim 54.

56. A method for making a support assembly for supporting a stage assembly, the stage assembly including a first component and a second component, the method comprising the steps of:

providing an outer frame to support the first component, the outer frame including an outer tube, an outer constraining tube and an outer dampener, the outer constraining tube being positioned within the outer tube, and the outer dampener being positioned between the outer tube and the outer constraining tube; and providing an inner frame to support the second component, the inner frame being positioned within a portion of the outer frame.

57. A method for making an exposure apparatus that forms an image on a wafer, the method comprising the steps of:

providing an irradiation apparatus that irradiates the wafer with radiation to form the image on the wafer; and providing the support assembly made by the method of claim 56.

58. A method for making a support assembly for supporting a stage assembly, the stage assembly including a first component and a second component, the method comprising the steps of:

providing an outer frame to support the first component; and providing an inner frame to support the second component, the inner frame being positioned within a portion of the outer frame, the inner frame including an inner tube, an inner constraining tube and an inner dampener, the inner constraining tube being positioned within the inner tube, and the inner dampener being positioned between the inner tube and the inner constraining tube.

59. A method for making an exposure apparatus that forms an image on a wafer, the method comprising the steps of:

providing an irradiation apparatus that irradiates the wafer with radiation to form the image on the wafer; and providing the support assembly made by the method of claim 58.

60. An apparatus comprising:

a stage assembly including a stage base, a stage, and a mover that moves the stage relative to the stage base the mover including a reaction component; and a support assembly that supports the stage assembly, the support assembly including an outer frame that supports the stage base and an inner frame that supports the reaction component without supporting the stage base, the inner frame being positioned within a portion of the outer frame.

61. The support assembly of claim 60 wherein the outer frame includes an outer tube and the inner frame includes an inner tube that is positioned within the outer tube.

62. The apparatus of claim 60 wherein the inner frame transfers reaction forces from the stage assembly to mounting base.

63. An exposure apparatus comprising:

a lens assembly;

an illumination system;

a control line; and a support assembly including an outer frame that supports the lens assembly and at least a portion of the control line and an inner frame that supports the illumination system, the inner frame being positioned within a portion of the outer frame.

64. A support assembly that supports a stage assembly, the stage assembly including at least a first component and a second component, the support assembly comprising:

an outer frame that supports the first component of the stage assembly, the outer frame including an outer tube; and an inner frame that supports the second component of the stage assembly, the inner frame including an inner that is positioned within the outer tube.

65. The support assembly of claim 64 wherein the inner member is a tube.

66. An apparatus including a stage assembly and the support assembly of claim 64.

67. An apparatus that is coupled to a mounting base, the apparatus comprising:

a stage assembly comprising a first component and a second component; and a plurality of support members that support the stage assembly relative to the mounting base, at least one of the support members comprising of a first frame and a second frame; wherein the first frame is adapted to support the first component of the stage assembly;

the second frame is adapted to support the second component of the stage assembly; and the first frame is disposed to surround the corresponding second frame.

68. The apparatus of claim 67, wherein the first frame has a monolithic member that surrounds the corresponding second frame.

69. The apparatus of claim 67, wherein each support member comprises the first frame and the second frame.

70. The apparatus of claim 67, wherein the stage assembly comprises a stage and a mover that moves the stage, the mover including a reaction component connected to the second frame.

71. An apparatus that is coupled to a mounting base, the apparatus comprising:
 a stage assembly including at least a first component and a second component; and
 a support assembly including a first frame that supports the first component and a second frame that support the second component, the first frame including a first side unit and the second frame including a first side unit, wherein the first side unit of the first frame is disposed to surround at least a portion of the first side unit of the second frame.

72. The apparatus of claim 71 wherein the first frame includes a second side unit and the second frame includes a second side unit, wherein the second side unit of the first frame is disposed to surround at least a portion of the second side unit of the second frame and wherein the first side unit of the first frame does not surround the second side unit of the second frame.

73. The apparatus of claim 71 wherein the first side unit of the first frame includes a monolithic member that surrounds the first side unit of the second frame.

74. The apparatus of claim 71 wherein the stage assembly comprises a stage and a mover that moves the stage, the mover including a reaction component connected to the second frame.

75. An apparatus comprising:
 a stage assembly including a stage base, a stage, and a mover that moves the stage relative to the stage base the mover including a reaction component; and
 a support assembly that supports the stage assembly, the support assembly including an outer frame that supports the stage base, the outer frame including an outer, tube and an inner frame that supports the reaction component, the inner frame including an inner tube that is positioned within the outer tube.

* * * * *

UNITED STATES PATENT AND TRADEMARK OFFICE
CERTIFICATE OF CORRECTION

PATENT NO.   : 6,646,719 B2
DATED        : November 11, 2003
INVENTOR(S)  : Lee et al.

It is certified that error appears in the above-identified patent and that said Letters Patent is hereby corrected as shown below:

Column 24,
Line 10, please replace "end" with -- and --.

Column 25,
Line 59, before the phrase "central axis", please insert -- a --.

Column 28,
Line 7, after the phrase "stage base", please insert -- , --.
Lines 19-20, before the phrase "mounting base", please insert -- a --.
Line 38, please replace "inner that" with -- inner member that --.

Column 29,
Line 6, please replace "support" with -- supports --.

Column 30,
Line 10, after the phrase "stage base", please insert -- , --.
Lines 14-15, please replace "outer, tube" with -- outer tube, --.

Signed and Sealed this

Ninth Day of March, 2004

JON W. DUDAS
*Acting Director of the United States Patent and Trademark Office*